(12) United States Patent
Umari et al.

(10) Patent No.: US 8,149,967 B2
(45) Date of Patent: Apr. 3, 2012

(54) COMBINED DUAL FEED-FORWARD AND FEEDBACK ANALOG AND DIGITAL AUTOMATIC GAIN CONTROL FOR BROADBAND COMMUNICATION

(75) Inventors: Maher Umari, Irvine, CA (US); Kaveh Razazian, Aliso Viejo, CA (US); Victor V. Loginov, Irvine, CA (US); Amir Hosein Kamalizad, Irvine, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 120 days.

(21) Appl. No.: 12/478,689

(22) Filed: Jun. 4, 2009

(65) Prior Publication Data
US 2009/0304130 A1 Dec. 10, 2009

Related U.S. Application Data

(60) Provisional application No. 61/059,713, filed on Jun. 6, 2008.

(51) Int. Cl.
*H04L 27/08* (2006.01)
*H04B 1/10* (2006.01)
*G08B 1/08* (2006.01)

(52) U.S. Cl. ........................... 375/345; 370/350
(58) Field of Classification Search .............. 375/345, 375/346, 316, 350, 285; 455/245.1, 250.1, 455/400, 402, 232.1, 234.1; 370/203, 206–209; 340/12.32, 538, 538.11, 538.12, FOR. 405
See application file for complete search history.

(56) References Cited

U.S. PATENT DOCUMENTS

| | | |
|---|---|---|
| 5,768,305 A | 6/1998 | Kanda |
| 5,841,385 A * | 11/1998 | Xie ........................ 341/139 |
| 6,347,234 B1 | 2/2002 | Scherzer |
| 6,415,004 B1 | 7/2002 | Fujimura et al. |
| 6,614,864 B1 | 9/2003 | Raphaeli et al. |
| 6,727,790 B2 | 4/2004 | Raphaeli et al. |
| 6,799,193 B2 | 9/2004 | Kilani et al. |
| 6,888,790 B2 | 5/2005 | Kilani |
| 6,976,044 B1 | 12/2005 | Kilani |
| 6,983,011 B1 | 1/2006 | Hara et al. |
| 7,020,095 B2 | 3/2006 | Chini et al. |
| 7,167,456 B2 | 1/2007 | Iwamatsu et al. |
| 7,430,193 B2 | 9/2008 | Kim et al. |
| 7,433,425 B1 | 10/2008 | Lou et al. |
| 7,634,034 B2 | 12/2009 | Larsson |

(Continued)

FOREIGN PATENT DOCUMENTS
EP 0657997 6/1995
(Continued)

OTHER PUBLICATIONS

"International Search Report and Written Opinion of the International Search Authority Dated Oct. 15, 2009", International Application No. PCT/US2009/046510.

(Continued)

*Primary Examiner* — Tesfaldet Bocure

(57) ABSTRACT

An embodiment is a method and apparatus to process an input signal. An analog automatic gain control (AGC) processor controls an analog adjustable gain of the input signal using a feedback mechanism. The analog AGC processor generates a first signal. A processing circuit transforms the first signal into a second signal. A digital AGC processor controls a digital adjustable gain of the second signal using a feed-forward mechanism.

27 Claims, 25 Drawing Sheets

U.S. PATENT DOCUMENTS

| | | | |
|---|---|---|---|
| 2002/0051499 A1 | 5/2002 | Cameron et al. | |
| 2002/0105901 A1 | 8/2002 | Chini et al. | |
| 2002/0132597 A1* | 9/2002 | Peterzell et al. | 455/130 |
| 2002/0188908 A1 | 12/2002 | Yonge, III et al. | |
| 2003/0235254 A1 | 12/2003 | Fanson et al. | |
| 2004/0062326 A1 | 4/2004 | Burke et al. | |
| 2004/0120249 A1 | 6/2004 | Blasco Claret et al. | |
| 2005/0163261 A1 | 7/2005 | Nakao et al. | |
| 2005/0281238 A1 | 12/2005 | Blasco Claret et al. | |
| 2006/0002494 A1* | 1/2006 | Zhang | 375/345 |
| 2006/0109939 A1* | 5/2006 | Ciccarelli et al. | 375/350 |
| 2006/0188033 A1* | 8/2006 | Zehavi et al. | 375/260 |
| 2007/0030913 A1 | 2/2007 | Lin | |
| 2007/0139118 A1 | 6/2007 | Teo et al. | |
| 2008/0143580 A1* | 6/2008 | Glazko et al. | 342/17 |
| 2009/0003308 A1 | 1/2009 | Baxley et al. | |
| 2009/0135977 A1 | 5/2009 | Sheu | |
| 2009/0190704 A1 | 7/2009 | Ben-Ari et al. | |

FOREIGN PATENT DOCUMENTS

| | | |
|---|---|---|
| EP | 0866580 | 9/1998 |
| EP | 1178634 | 2/2002 |
| EP | 1501226 | 1/2005 |
| EP | 1538744 | 6/2005 |
| GB | 2329804 | 3/1999 |
| WO | WO-01/13560 | 2/2001 |
| WO | WO 01/13560 | 2/2001 |
| WO | WO-02/49263 | 6/2002 |
| WO | WO 02/49263 | 6/2002 |
| WO | WO-03/056741 | 7/2003 |
| WO | WO 03/056741 | 7/2003 |
| WO | WO-03/100996 | 12/2003 |
| WO | WO 03/100996 | 12/2003 |
| WO | WO-2004/028105 | 4/2004 |
| WO | WO 2004/028105 | 4/2004 |
| WO | WO 2006/130502 | 12/2006 |
| WO | WO-2006/130502 | 12/2006 |

OTHER PUBLICATIONS

"Invitation to Pay Additional Fees and Accompanying Partial International Search by the International Searching Authority Dated Aug. 20, 2009", International Application No. PCT/US2009/046510.

"INT5200 Single Chip PowerPacket(TM) Transceiver, Revision 4", *Intellon Corporation*, Retrieved from the Internet: URL: http://www.datasheeet4u.com/html/I/N/T/INT5200_InTellon.pdf.html, (2005).

Chen, Yi-Fu, et al., "Baseband Transceiver Design of a 128-Kbps Power-Line Modem for Household Applications", *IEEE Transactions on Power Delivery*, vol. 17, No. 2, (Apr. 2002), pp. 338-344.

Gault, Sophie, et al., "An OFDMA Based Modem for PowerLine Communications over the Low Voltage Distribution Network", *IEEE, Power Line Communications and Its Applications, 2005 International Symposium*, (Apr. 6-8, 2005), pp. 42-46.

Heo, Kyung L., et al., "Design of a High Speed OFDM Modem System for Powerline Communications", *IEEE Workshop, Signal Processing Systems (SIPS)*, (Oct. 16-18, 2002), pp. 264-269.

Hsieh, Meng-Han, et al., "A Low-Complexity Frame Synchronization and Frequency Offset Compensation Scheme for OFDM Systems over Fading Channels", *IEEE Transactions on Vehicular Technology*, vol. 48, No. 5, (Sep. 1999), pp. 1596-1609.

Hsu, Christine, et al., "Improving HomePlug Power Line Communications with LDPC Coded OFDM", *Annual International Telecommunications Energy Conference, 28th, IEEE, PI*, (Sep. 1, 2006), pp. 1-7.

Kwan, Tom, et al., "Adaptive Detection and Enhancement of Multiple Sinusoids Using a Cascade IIR Filter", *IEEE Transactions on Circuits and Systems*, vol. 36, No. 7, (Jul. 1989), pp. 937-947.

"International Search Report and Written Opinion of the International Searching Authority Dated Oct. 16, 2009", International Application No. PCT/US2009/046502.

International Search Report and Written Opinion dated Oct. 16, 2009, for related International Application No. PCT/US2009/046502.

International Search Report and Written Opinion dated Apr. 15, 2010, for related International Application No. PCT/US2009/046519.

INT5200 Single Chip PowerPacket™ Transceiver, Revision 4, Intellon Corporation, Retrieved from the Internet: URL: http://www.datasheet4u.com/html/I/N/T/INT5200_InTellon.pdf.html,2005.

Chen, Yi-Fu, et al., Baseband Tranceiver Design of a 128-Kbps Power-Line Modem for Household Application, IEEE Transactions on Power Delivery, vol. 17, No. 2, Apr. 2002, pp. 338-344.

Gault, Sophie, et al., An OFDMA Based Modem for Power Line Communications Over the Low Voltage Distribution Network, IEEE, Power Line Communications and Its Applications, 2005 International Symposium, Apr. 6-8, 2005, pp. 42-46.

Heo, Kyung L., et al., Design of a High Speed OFDM Modem System for Powerline Communications, IEEE Workshop, Signal Processing Systems (SIPS), Oct. 16-18, 2002, pp. 264-269.

Hsieh, Meng-Han, et al., A Low-Complexity Frame Synchronization and Frequency Offset Compensation Scheme for OFDM Systems Over Fading Channels, IEEE Transactions on Vehicular Technology, vol. 48, No. 5, Sep. 1999, pp. 1596-1609.

Hsu, Christine, et al., Improving HomePlug Power Line Communications With LDPC Coded OFDM, Annual International Telecommunications Energy Conference 28th, IEEE, PI, Sep. 1, 2006, pp. 1-7.

Kwan, Tom, et al., Adaptive Detection and Enhancement of Multiple Sinusoids Using a Cascade IIR Filter, IEEE Transactions on Circuits and Systems, vol. 36, No. 7, Jul. 1989, pp. 937-947.

International Search Report and Written Opinion dated Mar. 17, 2010, for related International Application No. PCT/US2009/046514.

* cited by examiner

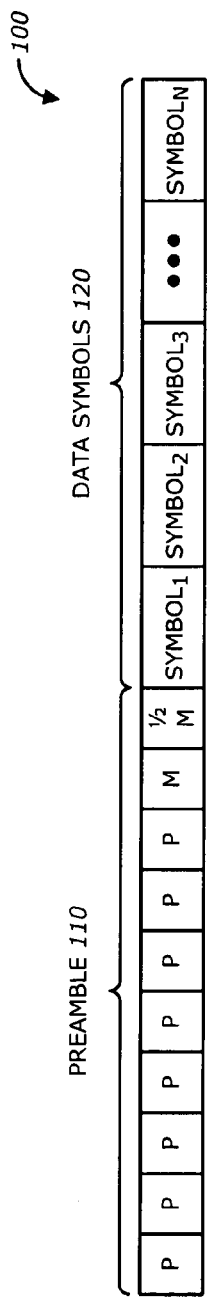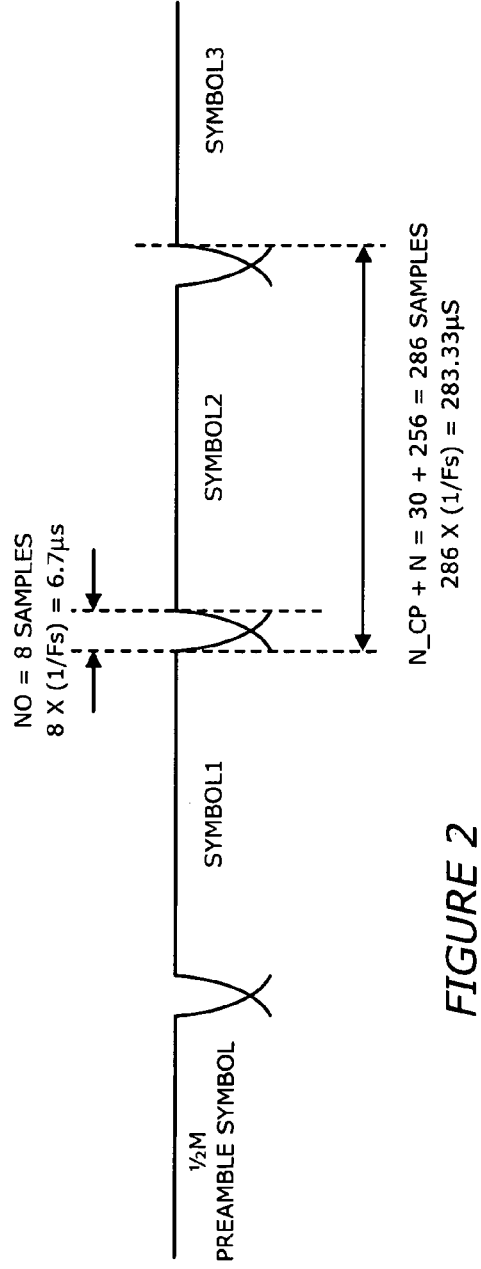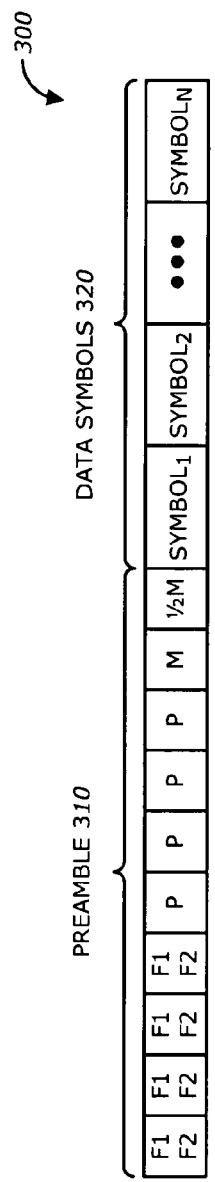
FIGURE 1
FIGURE 2
FIGURE 3

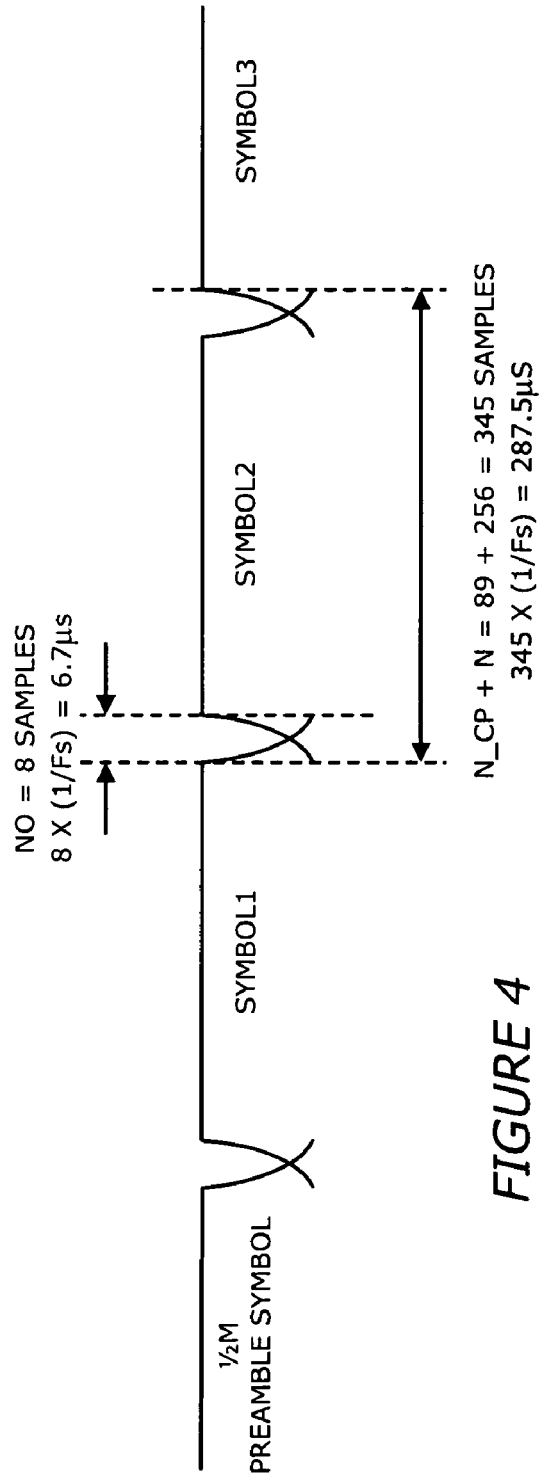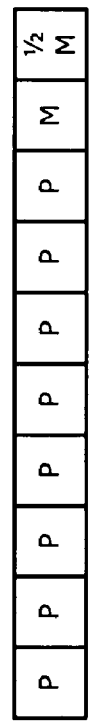
FIGURE 4
FIGURE 5
FIGURE 6

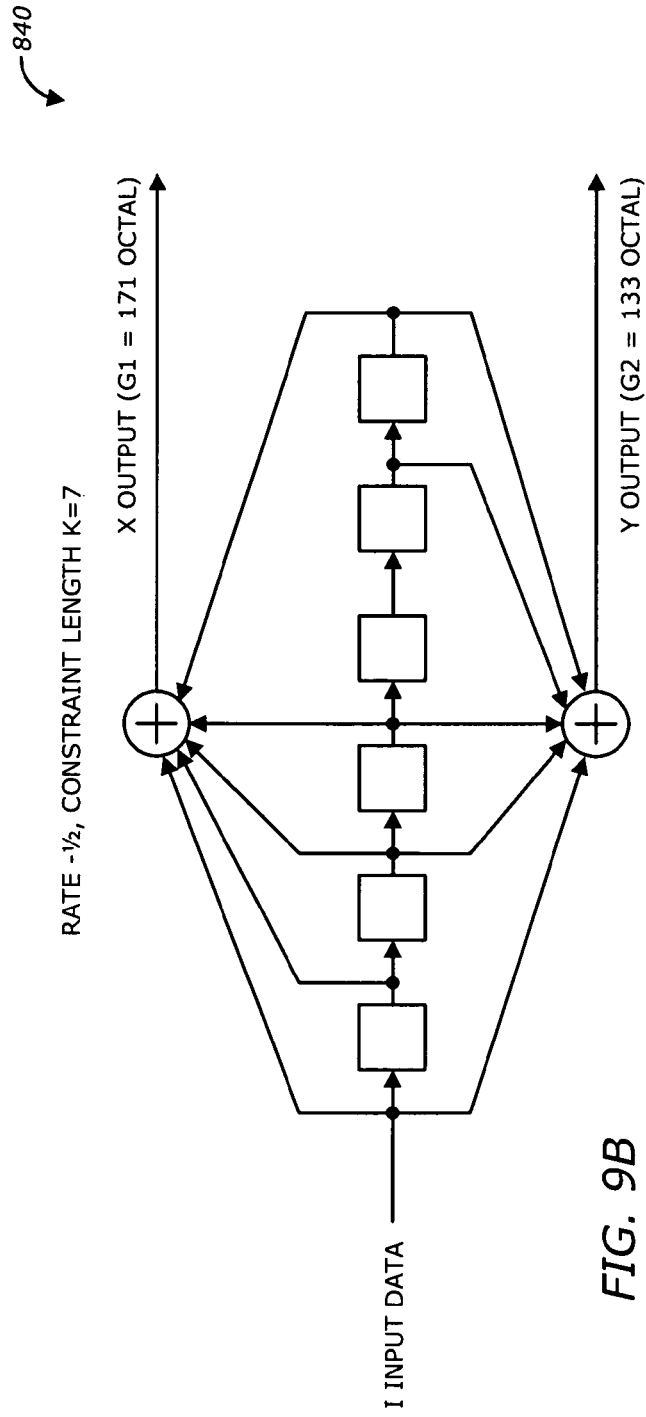
FIG. 9A
FIG. 9B

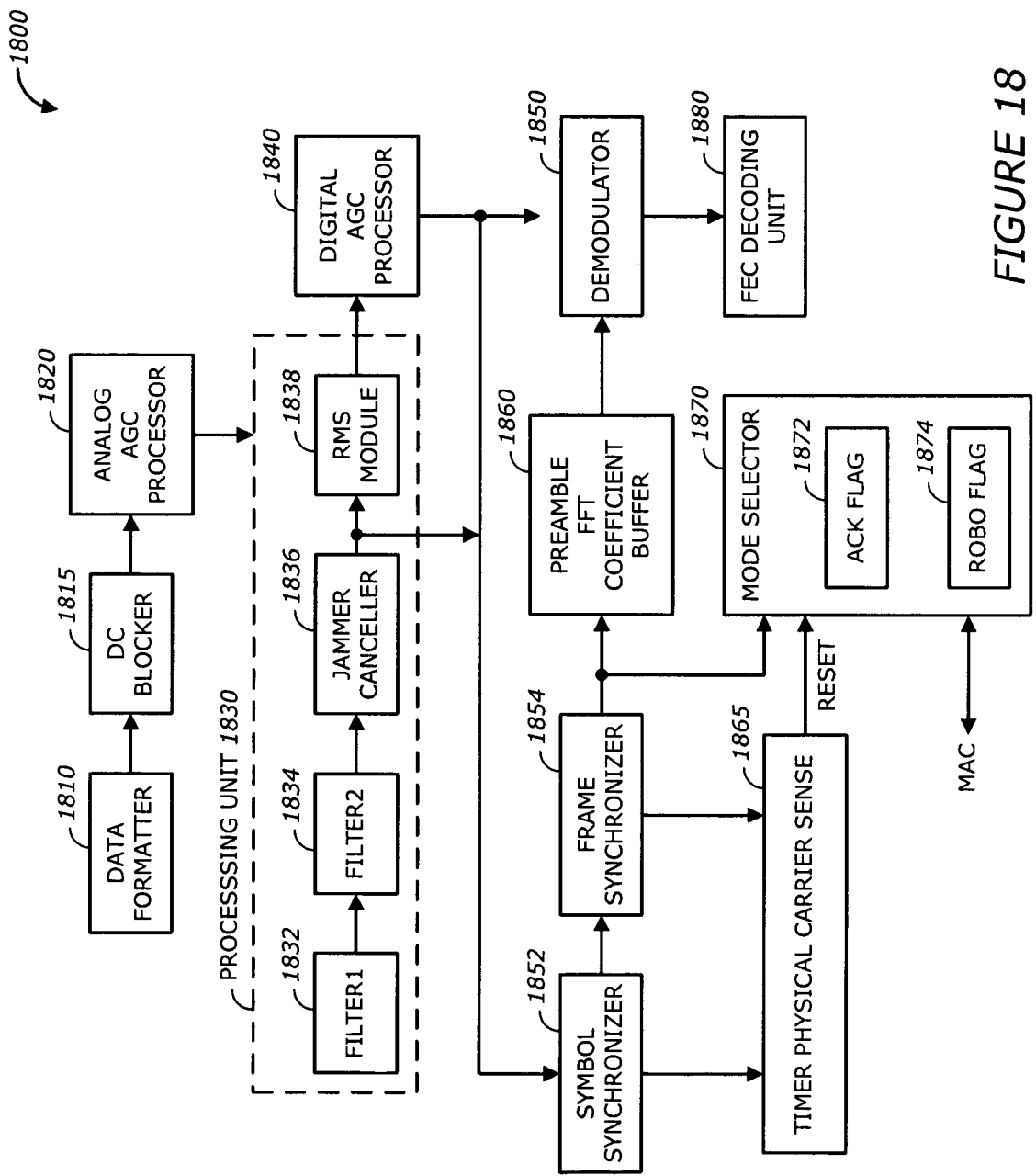

COMBINED DUAL FEED-FORWARD AND FEEDBACK ANALOG AND DIGITAL AUTOMATIC GAIN CONTROL FOR BROADBAND COMMUNICATION

RELATED APPLICATIONS

This application claims the benefits of the provisional application, filed on Jun. 6, 2008, titled "COMBINED DUAL FEED-FORWARD AND FEEDBACK ANALOG AND DIGITAL AUTOMATIC GAIN CONTROL (AGC) FOR BROADBAND COMMUNICATION", Ser. No. 61/059,713.

TECHNICAL FIELD

The presently disclosed embodiments are directed to the field of communication, and more specifically, to power line communication.

BACKGROUND

Power line communication (PLC) is a communication technology to carry data on electrical media (e.g., wires) that are used for electrical power transmission. Typically, electrical power is transmitted over high voltage transmission lines, distributed over medium voltage, and used inside commercial or residential buildings at lower voltages. Since power line networks transmit data signals over the same electrical grid as that is used for carrying electrical power to commercial or residential buildings, electrical wires and sockets are used simultaneously for electricity and for data transmission, without causing disruption to either.

Broadband technologies provide high speed data transmission. However, currently it is problematic to apply broadband technologies in PLC. Some problems include the ability to efficiently decode signals in noisy channels, achieve time and frequency diversity, remove signal interference, maintain received signals at pre-determined levels, measure channel quality for high transmission rate, provide robustness to wideband and narrow band symbol synchronization.

SUMMARY

One disclosed feature of the embodiments is a method and apparatus to process an input signal. An analog automatic gain control (AGC) processor controls an analog adjustable gain of the input signal using a feedback mechanism. The analog AGC processor generates a first signal. A processing circuit transforms the first signal into a second signal. A digital AGC processor controls a digital adjustable gain of the second signal using a feed-forward mechanism.

BRIEF DESCRIPTION OF THE DRAWINGS

Embodiments may best be understood by referring to the following description and accompanying drawings that are used to illustrate various embodiments. In the drawings.

FIG. 1 is a diagram illustrating a data frame structure used for data transmission and for the FCC, ARIB and CENELEC A bands according to one embodiment.

FIG. 2 is a diagram illustrating a symbol duration for data symbol according to one embodiment.

FIG. 3 is a diagram illustrating a data frame structure for data transmission for CENELECs B, C and BC according to one embodiment.

FIG. 4 is a diagram illustrating a symbol duration for data symbol for CENELC B and C according to one embodiment.

FIG. 5 is a diagram illustrating ACK signal for FCC, ARIB and CENELEC A according to one embodiment.

FIG. 6 is a diagram illustrating ACK signal for CENELEC B, C, and BC according to one embodiment.

FIG. 9A is a diagram illustrating the data scrambler according to one embodiment.

FIG. 9B is a diagram illustrating the convolutional encoder according to one embodiment.

FIG. 18 is a diagram illustrating a receiver according to one embodiment.

DETAILED DESCRIPTION

Figure 7:
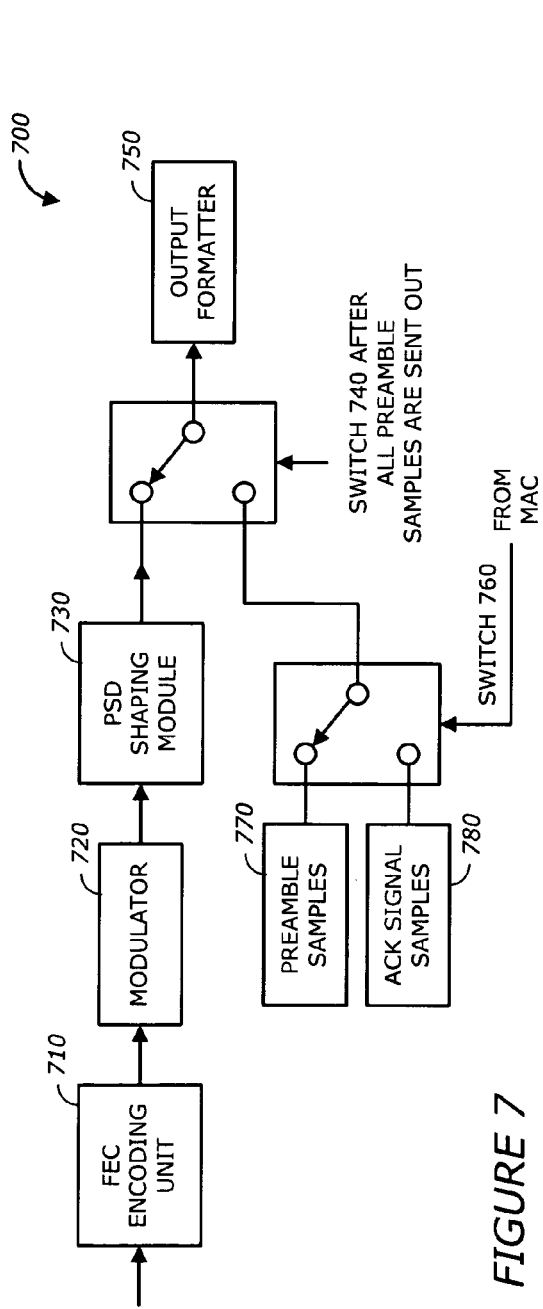
FIG. 7 is a diagram illustrating a base-band transmitter according to one embodiment.

One disclosed feature of the embodiments is a method and apparatus to process an input signal. An analog automatic gain control (AGC) processor controls an analog adjustable gain of the input signal using a feedback mechanism. The analog AGC processor generates a first signal. A processing circuit transforms the first signal into a second signal. A digital AGC processor controls a digital adjustable gain of the second signal using a feed-forward mechanism.

One disclosed feature of the embodiments may be described as a process which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a program, a procedure, a method of manufacturing or fabrication, etc. One embodiment may be described by a schematic drawing depicting a physical structure. It is understood that the schematic drawing illustrates the basic concept and may not be scaled or depict the structure in exact proportions.

One disclosed feature of the embodiments is the implementation of a data communication modem for Federal Communication Commission (FCC), Association of Radio Industries and Businesses (ARIB), and European Committee of electrotechnical standardization or Comité Européen de Normalisation Electrotecnique (CENELEC) bands over the power line medium. The system may include a highly integrated PHY (physical layer) and MAC (Media Access Control) digital transceiver and analog front end processing circuits. The system is based on Orthogonal Frequency Division Multiplexing (OFDM). OFDM has been chosen as the modulation technique because of its inherent adaptability in the presence of frequency selective channels, its resilience to jammer signals, and its robustness to impulsive noise.

The OFDM system may place $N_{carrier}$ evenly spaced carriers into a specified frequency band such as from DC to 1.2 MHz. In one embodiment, $N_{carrier}=128$. In the following description, the value $N_{carrier}=128$ will be used for illustrative purposes. It is contemplated that $N_{carrier}$ may be any suitable number. Depending on the band selection, number of carriers participating in transporting data varies. Every carrier may be modulated with Differential Binary Phase Shift Keying (DBPSK). The system may support two modes of operation namely Normal and ROBO (Robust OFDM). The ROBO modulation is robust in the sense that it may provide four times extra redundancy parity bits by mean of repetition code and therefore the system may reliably deliver data under severe channel conditions.

The system parameters include signal frequency bands, modulation schemes, sampling frequency and physical layer frame structure, etc. The system supports various CELENEC, FCC and ARIB bands. The frequency band associated with each standard is given in Table 1.

TABLE 1

FCC, ARIB and CENELEC Bands

|  | F Low (KHz) | F High (KHz) |
| --- | --- | --- |
| FCC | 10 | 480 |
| ARIB | 10 | 450 |
| CELENEC A | 9 | 95 |
| CELENEC B | 95 | 125 |
| CELENEC C | 125 | 140 |
| CELENEC B, C | 95 | 140 |

An OFDM with DBPSK modulation scheme per carrier may be selected. The OFDM modulation technique is very robust against channel fading, narrowband interference and spike noise. The DBPSK modulation for each carrier may make the receiver design significantly simple since no tracking circuitry is required at the receiver for coherently detecting the phase of each carrier. In DBPSK demodulator, the phases of carriers in adjacent symbol may be taken as the reference for detecting the phases of the carriers in the current symbol. The phases of corresponding carriers in adjacent OFDM symbols may be expected to be stationary since the channel and the clock frequency variations in time are very slow as compared to the duration of two adjacent symbols.

Assuming the maximum spectral content of the signal is 480 KHz, the sampling frequency at the transmitter and receiver may be selected to be 1.2 MHz that is about 240 KHz above the Nyquist rate to provide a sufficient margin for signal filtering in the transmitter (for PSD shaping to remove the signal images) and at the receiver (for band selection and signal enhancement).

The number of frequency bins (FFT points) may be any suitable number. In one embodiment, this number is selected to be N=256. This results in a frequency resolution for the OFDM carriers equal to 4.6875 KHz (Fs/N). Note that imperfection such as sampling clock frequency variation may cause Inter Carrier Interference (ICI). In practice, the ICI caused by a typical sampling frequency variation about 2% of frequency resolution is negligible. In other word, considering ±20 ppm sampling frequency in transmitter and receiver clocks, the drift of the carriers may be approximately equal to 48 Hz that is approximately 1.26% of the selected frequency resolution. Considering these selections, the number of usable carriers for each standard may be obtained as given in Table 2.

TABLE 2

Number of carriers for various bands

|  | Number of Carriers (Ncarr) (KHz) | First Carrier (KHz) | Last Carrier (KHz) |
| --- | --- | --- | --- |
| FCC | 100 | 14.063 | 478.125 |
| ARIB | 93 | 14.0625 | 445.3125 |
| CELENEC A | 19 | 9.375 | 93.75 |
| CELENEC B | 6 | 98.4375 | 121.875 |

TABLE 2-continued

Number of carriers for various bands

|  | Number of Carriers (Ncarr) | First Carrier (KHz) | Last Carrier (KHz) |
|---|---|---|---|
| CELENEC C | 3 | 126.5625 | 135.9375 |
| CELENEC B, C | 9 | 98.4375 | 135.9375 |

The system may work in two different modes namely Normal and ROBO modes. In Normal mode, the FEC may include a Reed Solomon encoder and a convolutional encoder. The system may also support Reed Solomon code with parity of 8 and 16 Bytes.

In ROBO mode (robust modulation scheme) the FEC may include Reed Solomon and convolutional encoders followed by a Repetition Code (RC). The RC code may repeat each bit four times making system more robust to channel impairments. This of course may reduce the throughput by a factor of 4. The FEC parameters for RS parity of 8 may be given in Table 3.

TABLE 3

FEC Parameters

|  | Normal Mode | ROBO Mode |
|---|---|---|
| FCC | ½ convolutional Code + Reed Solomon (241/249) | ½ convolutional Code + Reed Solomon (53/61) + RC (4) |
| ARIB | ½ convolutional Code + Reed Solomon (223/231) | ½ convolutional Code + Reed Solomon (49/57) + RC (4) |
| CENELEC A | ½ convolutional Code + Reed Solomon (181/189) | ½ convolutional Code + Reed Solomon (38/46) + RC (4) |
| CENELEC BC | ½ convolutional Code + Reed Solomon (171/179) | ½ convolutional Code + Reed Solomon (36/44) + RC (4) |
| CENELEC B | ½ convolutional Code + Reed Solomon (111/119) | ½ convolutional Code + Reed Solomon (21/29) + RC (4) |
| CENELEC C | ½ convolutional Code + Reed Solomon (111/119) | ½ convolutional Code + Reed Solomon (21/29) + RC (4) |

The number of symbols in each PHY (Physical Layer) frame may be selected based on two parameters, the required data rate and the acceptable delay. Since high bandwidth standard (FCC, ARIB) may be utilized for some delay sensitive applications such as voice transmission, therefore the number of symbols in PHY frame may be selected less that that of low bandwidth standard (CENELEC). The number of symbols and data rate associated with each band may be tabulated in Table 4. To calculate the data rate, the packets may be assumed to be continuously transmitted with no inter frame time gap.

TABLE 4

Data rate for various standards

|  | Data Rate (DBPSK)(kbps) | Data Rate (ROBO)(kbps) | No. of symbols per PHY Frame (Ns) |
|---|---|---|---|
| FCC | 170 | 37 | 40 |
| ARIB | 157 | 34 | 40 |
| CELENEC A | 37 | 7.7 | 160 |
| CELENEC B | 9.71 | 1.84 | 320 |
| CELENEC C | 4.9 | 0.93 | 640 |
| CELENEC B, C | 14.95 | 3.15 | 320 |

The data rate may be calculated based on the number of symbols per PHY frame (NS), number of carrier per symbol (Ncarr) and number of parity bits added by FEC blocks. As an example, consider the system in the FCC band working in ROBO mode. Total number of bits carried by the whole PHY frame may be equal to:

Total_No_Bits=$NS \times Ncarr$=40×100=4000 bits

The number of bits required at the input of ROBO encoder may be given by:

No_Bits_ROBO=4000×ROBORate=4000×¼=1000 bits

Considering the fact that convolutional encoder may have a rate equal to ½ (CCRrate=½) and also consider adding CCZerotail=6 bits of zeros to terminate the states of the encoder to all zero states then the maximum number of symbols at the output of Reed Solomon encoder (MAXRSbytes) may be equal to:

MAXRSbytes=floor((No_Bits_ROBO×CCRate×CCZeroTail)/8)=floor((1000×½−6)/8)=61

Symbols: Removing 8 symbols associated with the parity bits, we may obtain:

DataLength=(61−ParityLength)×8=424 bits

These 424 bits may be carried within the duration of a PHY frame. The duration of a PHY frame may be calculated by the following formula:

T_Frame=(($NS \times (N\_CP+N-NO)+(Npre \times N)$))/Fs where Npre, N, NO and N_CP are the number of samples in the preamble, FFT length, the number of samples overlapped at each side of one symbol and the number of samples in the cyclic prefix, respectively. The Fs is the sampling frequency. Typical values for all these parameters for various frequency bands may be given in Table 5.

TABLE 5

Parameters for various frequency bands

| Number of FFT points | N = 256 |
|---|---|
| Number of overlapped samples | NO = 8 |
| Number of cyclic Prefix (CENELEC B and C) | N_CP = 89 |
| Number of cyclic Prefix (FCC, ARIB, CENELEC A) | N_CP = 30 |
| Sampling frequency | Fs = 1.2 MHz |

Replacing the above numbers in the equation, T-Frame (PHY frame duration) may be obtained as follows:

T_Frame=(40×(256+22)+(9.5×256))/1200000=0.0112 sec.

Therefore the data rate may be calculated by:

Data rate=424/0.0112~37 kbps

Signal Types: There are 2 transmission commands to the physical layer as described below.

FIG. 1 is a diagram illustrating a data frame structure 100 used for data transmission and for the FCC, ARIB and CENELEC A bands according to one embodiment. The data frame 100 includes a preamble portion 110 and a data symbol portion 120.

The preamble 110 may include 8 identical P symbols and 1½ identical M symbols. Each symbol may be 256 samples and may be pre-stored in the transmitter and may be transmitted right before the data symbols. The symbols P may be used for AGC adaptation, symbol synchronization, channel estimation and initial phase reference estimation. For M symbols, two types of symbol may be used. One is the M1 in which all the carriers may be π phase shifted and the other one is M2 in which all the carriers may be π/2 phase shifted. M1 is used in ROBO mode and M2 may be used in Normal mode. At the receiver, the phase distance between symbol P and symbol M waveforms may be used for frame synchronization purpose. And the distance between the phases of two possible M symbols may be used to detect whether the PHY frame is sent in Normal mode or in ROBO mode.

FIG. 2 is a diagram illustrating a symbol duration for data symbol according to one embodiment. Each symbol may have 8 samples overlapped with adjacent symbols. The last 8 samples (tail) of preamble may also be overlapped with the 8 samples of the first data symbol (head) as shown in the FIG. 2. The overlap may be included to smooth the transition between symbols thus reducing the out of band spectral growth.

FIG. 3 is a diagram illustrating a data frame structure 300 for data transmission for CENELECs B, C and BC according to one embodiment. The data frame 300 includes a preamble portion 310 and a data symbol portion 320.

The preamble 310 for CENELECs B, C & BC bands may include for special symbols labeled as F1F2 symbols, followed by four identical P symbols and 1½ identical M symbols. For CENELEC C, each F1F2 symbol may include three sinewaves whose phases may switch by 180° after 256 samples. Hence, we generate 256 samples of each of the three tones and sum them together, then we add 180° phase shift to each of the three tones and generate another 257 samples, so that the total length of an F1F2 symbol may be 513 samples. For CENELECs B & BC, six tones may be used instead of three, but the length of the F1F2 symbols remains unchanged. The F1F2 symbols may be used for synchronization. Each preamble symbol may contain 513 samples. The reason that we have used a different technique for synchronization is that the allocated bandwidth in CENELECs C, B and BC may be too small, which makes the autocorrelation property of the P symbols not good enough for robust synchronization. As a result, F1F2 symbols may be used. They have much better autocorrelation property. As for the P symbols for narrowband, they may still be used for channel estimation and initial phase reference estimation, same as was the case for wideband. The symbols M1 or M2 proposed for FCC, ARIB and CENELEC standards are also used for narrowband for the same purposes (frame synchronization and mode detection).

FIG. 4 is a diagram illustrating a symbol duration for data symbol for CENELC B and C according to one embodiment. Again, the same approach is used for PHY frame in ROBO mode that is the P and M symbol are exchanged.

ACK/NACK Signal

FIG. 5 is a diagram illustrating ACK signal for FCC, ARIB and CENELEC A according to one embodiment. This signal may be used when an acknowledgement is required to confirm whether the data is correctly received (ACK) or it is erroneous (NACK). The same waveform used in preamble with modified M symbol may be used as an ACK signal. The P with 90 degrees shift (M=jP) and P with 180 degrees shift (M=−P) may already reserved for normal mode and ROBO mode respectively. The P with 270 degrees shift (M=−jP) may be proposed to be used for ACK signaling.

This may simplifies the system, as only one waveform need to be stored in the transmitter and same detection circuit in the receiver as used for preamble detection, is used for ACK signal detection as well. If no signal is received during the specified period, it is interpreted as a NACK signal.

FIG. 6 is a diagram illustrating ACK signal for CENELEC B, C, and BC according to one embodiment. Again the same symbols as used for the preamble for the purpose of synchronization, may also be used for the ACK signal. During the time period that a device is waiting for an acknowledgement, the reception of this signal may be an indication that the data may have been delivered with no error. If the time expires and the ACK signal has not been received, it may be an indication that the data may have been lost or delivered in errors.

FIG. 7 is a diagram illustrating a base-band transmitter 700 according to one embodiment. The base-band transmitter 700 includes a Forward Error Correction (FEC) encoding unit 710, a modulator 720, a power spectral shaping (PSD) module 730, a switch 740, an output formatter 750, and a switch 760.

The base-band transmitter 700 may receive its input bits in one packet from the Media Access (MAC) Layer. The FEC encoding unit 710 may include a number of FEC encoders. Each FEC encoder may add parity bits to the data and the packet grows as it goes through various blocks in FEC encoding unit 710. At the end of the FEC encoding unit 710, the final packet may be broken down into small packet so that each small packet may be fitted into one OFDM symbol. The size of one small packet depends on the number of carriers used in each OFDM symbol. For example, in FCC band, the packet size becomes equal to 100 bits. In order to understand the size of data as well as signal dimensions at each various points in the transmitter baseband, the calculation method may be described in the following.

Packet Size Calculation:

The total number of bits carried by a PHY frame may be obtained by:

$$N_F = N_G = Ncarr \times Ns$$

The $N_F$ and $N_G$ may represent the size of packet (signal) at nodes (F) and (G), respectively. Where Ncarr is the number of carriers in each OFDM symbol and Ns is the number of symbols per PHY frame. Note that the Interleaver does not change the size of packet. The number of bits at point (E) may be given by:

$$N_E = N_F \times R$$

The value R may be one for Normal mode and ¼ for ROBO Mode. In order to find M, the number of zeros may need to be padded at the output of convolutional encoder; first we need to calculate the maximum number of RS bytes. The maximum number of RS bytes (MaxRSbytes) at the output of RS encoder may be obtained by the following equation:

$$\text{MaxRSbytes} = \text{floor}((N_E \times \text{CCRate} - \text{CCZeroTail})/8)$$

Where CCRate and CCZeroTail are the convolutional code rate (½) and the number of zeros to be added to the input of convolutional encoder (to terminate the states to zero state), respectively. And "8" refers to the length of each RS word that is one byte. Therefore, the value of M may be obtained by:

$$M = N_E - ((\text{MaxRSbytes} \times 8) + 6) \times 2$$

Table 6 shows the number of zeroes padded after convolutional encoder for various bands.

TABLE 6

Number of zeroes padded after convolutional encoder

| | ROBO (Bits) | Normal (bits) |
|---|---|---|
| FCC | M = 12 | M = 4 |
| ARIB | M = 6 | M = 12 |
| CELENEC A | M = 12 | M = 4 |
| CELENEC B | M = 4 | M = 4 |
| CELENEC C | M = 4 | M = 4 |
| CELENEC B, C | M = 4 | M = 4 |

The number of bits at point (D), (C) and (B) now may be calculated by:

$$N_D = N_E - M, N_C = N_D/2, N_B = N_C - 6$$

Finally, considering the fact the number of parity bytes in RS code may be equal to 8, the packet size delivered by MAC to the physical layer may be given by:

$$N_A = (N_B/8 - 8) \times 8$$

Table 7 summarizes the input packet to the physical layer for various band and both normal and ROBO modes. It should be noted that CENELEC B and CENELEC C ROBO may not be able to have long header format (48-bit addressing) and RS parity of 16 Bytes at the same time because of the size of the packet limitations.

TABLE 7

Packet size delivered by MAC layer to PHY layer

|  | ROBO (bits) | Normal (bits) |
|---|---|---|
| FCC | 424 | 1928 |
| ARIB | 392 | 1784 |
| CELENEC A | 304 | 1448 |
| CELENEC B | 168 | 888 |
| CELENEC C | 168 | 888 |
| CELENEC B, C | 288 | 1368 |

Figure 8:
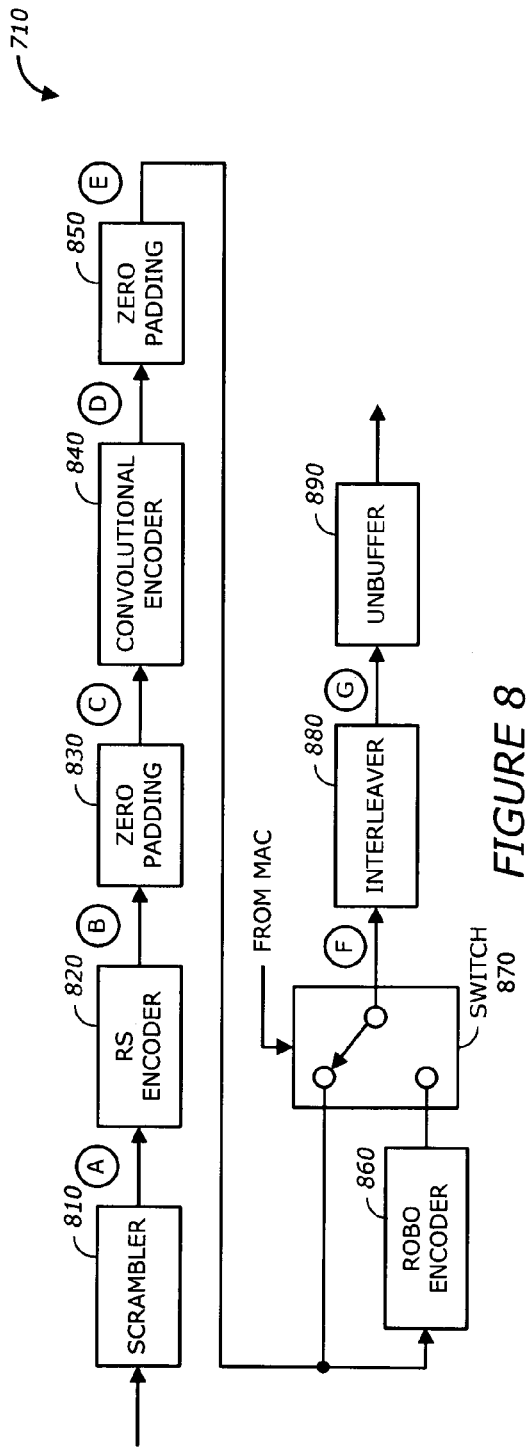
FIG. 8 is a diagram illustrating the FEC encoding unit according to one embodiment.

The packet size at various nodes in the FEC encoding unit 710 for each band (CENELEC (A,B,BC)/FCC/ARIB) may be calculated and summarized in Tables 8A, 8B, 8C, 8D, 8E, and 8F. The nodes A, B, C, D, E, and F are shown in FIG. 8.

TABLE 8A

Packet Size at various node of FEC encoder for FCC band

| FEC Node | Normal Mode | ROBO Mode |
|---|---|---|
| A | 1928 | 424 |
| B | 1992 | 428 |
| C | 1998 | 494 |
| D | 3996 | 988 |
| E | 4000 | 1000 |
| F | 4000 | 4000 |

TABLE 8B

Packet Size at various node of FEC encoder for ARIB band

| FEC Node | Normal Mode | ROBO Mode |
|---|---|---|
| A | 1784 | 392 |
| B | 1848 | 456 |
| C | 1854 | 462 |
| D | 3708 | 924 |
| E | 3720 | 930 |
| F | 3720 | 3720 |

TABLE 8C

Packet Size at various nodes of FEC encoder for CENELEC A band

| FEC Node | Normal Mode | ROBO Mode |
|---|---|---|
| A | 1448 | 304 |
| B | 1512 | 368 |
| C | 1518 | 374 |

TABLE 8C-continued

Packet Size at various nodes of FEC encoder for CENELEC A band

| FEC Node | Normal Mode | ROBO Mode |
|---|---|---|
| D | 3036 | 748 |
| E | 3040 | 760 |
| F | 3040 | 3040 |

TABLE 8D

Packet Size at various node of FEC encoder for CENELEC B band

| FEC Node | Normal Mode | ROBO Mode |
|---|---|---|
| A | 888 | 168 |
| B | 952 | 232 |
| C | 958 | 238 |
| D | 1916 | 476 |
| E | 1920 | 480 |
| F | 1920 | 1920 |

TABLE 8E

Packet Size at various node of FEC encoder for CENELEC C band

| FEC Node | Normal Mode | ROBO Mode |
|---|---|---|
| A | 888 | 168 |
| B | 952 | 232 |
| C | 958 | 238 |
| D | 1916 | 476 |
| E | 1920 | 480 |
| F | 1920 | 1920 |

TABLE 8F

Packet Size at various nodes of FEC encoder for CENELEC BC band

| FEC Node | Normal Mode | ROBO Mode |
|---|---|---|
| A | 1368 | 288 |
| B | 1432 | 352 |
| C | 1438 | 358 |
| D | 2876 | 716 |
| E | 2880 | 720 |
| F | 2880 | 2880 |

FIG. 8 is a diagram illustrating the FEC encoding unit 710 according to one embodiment. The FEC encoding unit 710 includes a data scrambler 810, a Reed-Solomon (RS) encoder 820, a zero padding 830, a convolutional encoder 840, a zero padding 850, a ROBO encoder 860, a switch 870, an interleaver 880, and an un-buffer 890. It is noted that the FEC encoding unit 710 may include more or less than the above elements. In addition, any one of the above elements may be implemented by hardware, software, firmware, or any combination of hardware, software, and firmware.

The FEC encoders may include Reed Solomon encoder 820 followed by convolutional encoder 840. In ROBO mode, an extra encoder namely Repetition Code (RC) or ROBO encoder 860 may be used after the convolutional encoder 840 that repeats the bits at the output of convolutional encoder 840 four times The data scrambler 810 may help give the data a random distribution. FIG. 9A is a diagram illustrating the data scrambler 810 according to one embodiment. The data stream may be XOR-ed with a repeating pseudo random number (PN) sequence using the following generator polynomial: $S(x)=x^7+x^4+1$. The bits in the scrambler are initialized to all ones at the start of processing each PHY frame.

The RS encoder 820 encodes data from the scrambler 810. The RS encoder 820 may be may be created by shortening RS (255,247, t=4) and (255,239, t=8) code. The "RS symbol word length" (i.e., the size of the data words used in the Reed-Solomon block) may be fixed at 8 bits. The value of t (number of word errors that can be corrected) may be either 4 or 8 for different standards. For CENELEC B and C ROBO the RS parity of 8 Bytes (corresponding to t=4) should be used. The number of parity words in a RS-block is thus 2t words. The number of non-parity data words (bytes) in Reed-Solomon encoder 820 may be provided in Table 3. The first bit in time from the data scrambler 810 may become the most significant bit of that symbol. Each RS encoder input block (consisting of 247 symbols) is conceptually formed by one or more fill symbols ("00000000") followed by the message symbols. Output of the RS encoder (with fill symbols discarded) may proceed in time from first message symbol to last message symbol followed by parity symbols, with each symbol shifted out most significant bit first.

Code Generator Polynomial $g(x)=(x-\alpha^1)\ (x-\alpha^2)\ (x-\alpha^3)\ldots(x-\alpha^8)$ Field Generator Polynomial: $p(x)=x^8+x^4+x^3+x^2+1$ (435 octal)

TABLE 9

RS encoder input/output packet size

|  | Normal Mode $N_A/N_B$ (Bytes) | ROBO Mode $N_A/N_B$ (Bytes) |
|---|---|---|
| FCC | 241/249 | 53/61 |
| ARIB | 223/231 | 49/57 |
| CENELEC A | 181/189 | 38/46 |
| CENELEC BC | 171/179 | 36/44 |
| CENELEC B | 111/119 | 21/29 |
| CENELEC C | 111/119 | 21/29 |

The representation of $\alpha^0$ is "00000001", where the left most bit of this RS symbol is the MSB and is first in time from the scrambler 810 and is the first in time out of the RS encoder 820. The packet size (in Bytes) at the input and output of RS encoder 820 ($N_A$ and $N_B$) may be given in Table 9.

The zero padding 830 may pad six zeroes after the RS encoder 820.

FIG. 9B is a diagram illustrating the convolutional encoder 840 according to one embodiment. The convolutional encoder 840 may encode the bit stream at the output of the Reed-Solomon encoder 820 with a standard rate=½, K=7. The tap connections are defined as x=0b1111001 and y=0b1011011, as shown in FIG. 9B.

When the last bit of data to the convolutional encoder 840 may have been received, the convolutional encoder 840 may insert six tail bits, which may be required to return the convolutional encoder 840 to the "zero state". This may improve the error probability of the convolutional decoder, which relies on future bits when decoding. The tail bits may be defined as six zeros. The number of bits at the input and the output of convolutional encoder may be given in Table 10.

TABLE 10

Convolutional encoder input/output packet sizes

|  | Normal Mode $N_A/N_B$ (bits) | ROBO Mode $N_A/N_B$ (bits) |
|---|---|---|
| FCC | 1998/3996 | 494/988 |
| ARIB | 1854/3708 | 462/924 |
| CENELEC A | 1518/3036 | 374/748 |
| CENELEC BC | 1438/2876 | 358/716 |
| CENELEC B | 958/1916 | 238/476 |
| CENELEC C | 958/1916 | 238/476 |

The zero padding 850 may pad M zeroes after the convolutional encoder 840. M is given in Table 6.

The ROBO encoder 860 repeats the resulting packet after adding M number of zeros to the packet four times in ROBO mode. The ROBO encoder 860 may be only activated in ROBO mode. The repeat code may be implemented inside the interleaver 880. The switch 870 selects whether to bypass the ROBO encoder 860 or uses the output of the ROBO encoder 860 in ROBO mode.

The interleaver 880 interleaves the data packet selected from the switch 870. It may be used for both normal mode and ROBO mode. The interleaver 880 may use a linear block interleaver and may achieve the same performance of a random interleaver using a simpler architecture with less computation.

The un-buffer 890 breaks down the final packet into small packet so that each small packet may be fitted into one OFDM symbol, as described earlier.

Figure 10:
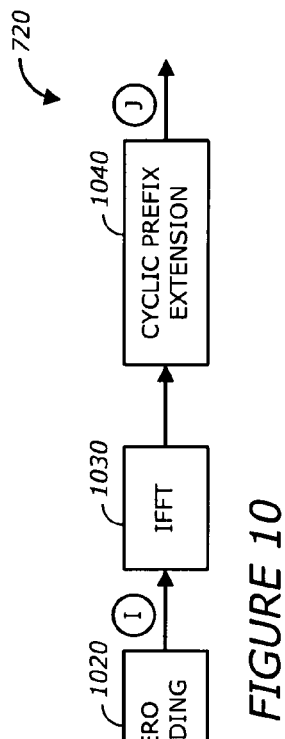
FIG. 10 is a diagram illustrating the modulator according to one embodiment.

FIG. 10 is a diagram illustrating the modulator 720 according to one embodiment. The modulator 720 includes a DBPSK modulator 1010, a zero padding 1020, an inverse Fast Fourier Transform (IFFT) 1030, and a cyclic prefix (CP) extension 1040. It is noted that the modulator 720 may include more or less than the above elements. In addition, any one of the above elements may be implemented by hardware, software, firmware, or any combination of hardware, software, and firmware.

Figure 11A:
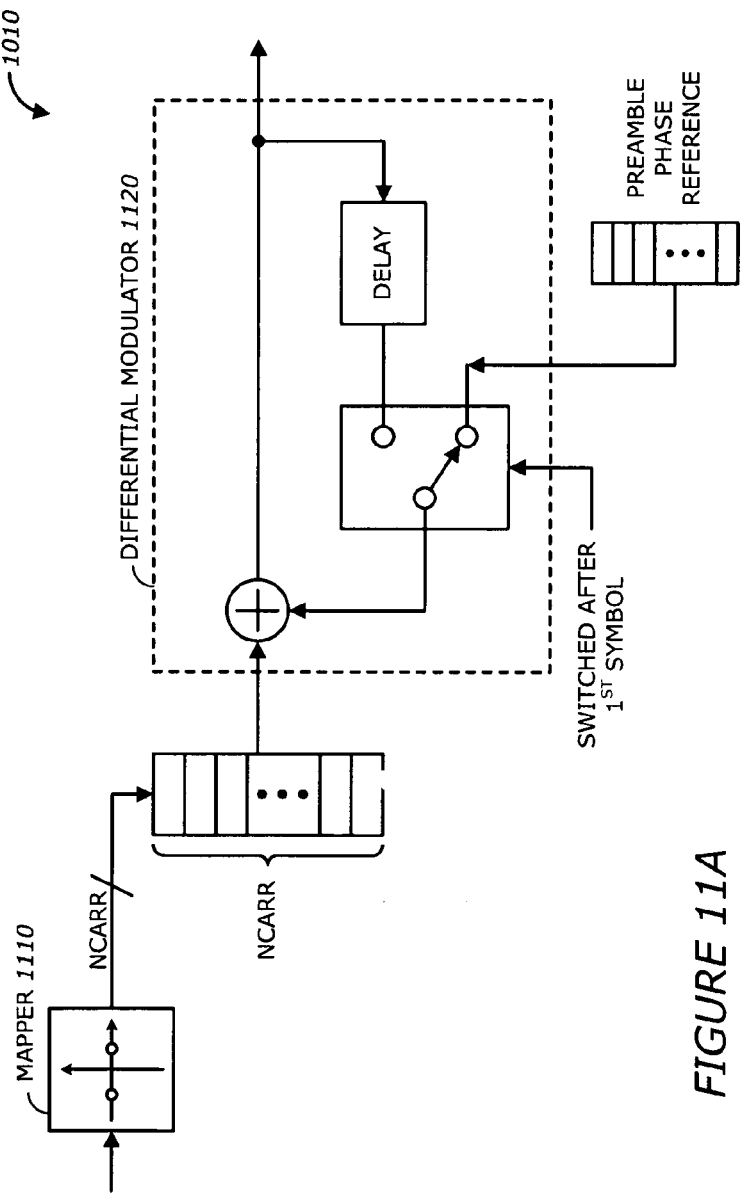
FIG. 11A is a diagram illustrating the DBPSK modulator according to one embodiment.

FIG. 11A is a diagram illustrating the DBPSK modulator 1010 according to one embodiment. The DBPSK modulator 1010 includes a mapper 1110 and a differential modulator 1120.

The mapper 1110 map data bits for differential modulation. Each phase vector may use its predecessor (same carrier, previous symbol) as phase reference. The mapping function for DBPSK may be given in Table 11.

TABLE 11

DBPSK Encoding Table of Kth Sub carrier

| Input Bit | Output Phase |
|---|---|
| 0 | $\Psi_k$ |
| 1 | $\Psi_k + \pi$ |

The initial phase for the first symbol are the carrier phases of the preamble symbol and are provided in Table 12. Each value in Table 12 may be a multiple integer of $\pi/8$ and may be quantized by 4 bits. The preamble phase reference index in Table 12 may start from 1 and it may refer to the first carrier in the corresponding band as given in Table 13. Note that the carrier index may be numbered from 0 to 127. This may be been illustrated in FIG. 11B.

TABLE 12

Preamble Phase Vector Definition

| c | FCC $\phi_c$ | ARIB $\phi_c$ | CNLC A $\phi_c$ | CNLC B $\phi_c$ | CNLC C $\phi_c$ | CNLC BC $\phi_c$ |
|---|---|---|---|---|---|---|
| 1 | 14 | 14 | 14 | X | X | X |
| 2 | 14 | 14 | 13 | X | X | X |
| 3 | 13 | 13 | 11 | X | X | X |
| 4 | 13 | 12 | 9 | X |  | X |
| 5 | 12 | 12 | 6 | X |  | X |
| 6 | 11 | 11 | 2 | X |  | X |
| 7 | 10 | 10 | 12 |  |  | X |
| 8 | 9 | 8 | 6 |  |  | X |
| 9 | 8 | 7 | 14 |  |  | X |
| 10 | 6 | 6 | 6 |  |  |  |
| 11 | 5 | 4 | 12 |  |  |  |
| 12 | 3 | 2 | 2 |  |  |  |
| 13 | 1 | 0 | 7 |  |  |  |
| 14 | 14 | 13 | 10 |  |  |  |
| 15 | 12 | 11 | 13 |  |  |  |
| 16 | 9 | 8 | 15 |  |  |  |
| 17 | 7 | 5 | 0 |  |  |  |
| 18 | 4 | 2 | 1 |  |  |  |
| 19 | 1 | 15 | 1 |  |  |  |
| 20 | 14 | 11 |  |  |  |  |
| 21 | 10 | 8 |  |  |  |  |
| 22 | 7 | 4 |  |  |  |  |
| 23 | 4 | 0 |  |  |  |  |
| 24 | 0 | 12 |  |  |  |  |
| 25 | 11 | 8 |  |  |  |  |
| 26 | 8 | 4 |  |  |  |  |
| 27 | 3 | 15 |  |  |  |  |
| 28 | 15 | 10 |  |  |  |  |
| 29 | 10 | 5 |  |  |  |  |
| 30 | 5 | 0 |  |  |  |  |
| 31 | 0 | 11 |  |  |  |  |
| 31 | 11 | 5 |  |  |  |  |
| 33 | 6 | 0 |  |  |  |  |
| 34 | 0 | 10 |  |  |  |  |
| 35 | 11 | 4 |  |  |  |  |
| 36 | 5 | 14 |  |  |  |  |
| 37 | 15 | 7 |  |  |  |  |
| 38 | 9 | 1 |  |  |  |  |
| 39 | 3 | 10 |  |  |  |  |
| 40 | 12 | 3 |  |  |  |  |
| 41 | 6 | 12 |  |  |  |  |
| 42 | 15 | 5 |  |  |  |  |
| 43 | 8 | 14 |  |  |  |  |
| 44 | 1 | 6 |  |  |  |  |
| 45 | 10 | 14 |  |  |  |  |
| 46 | 3 | 7 |  |  |  |  |
| 47 | 11 | 14 |  |  |  |  |
| 48 | 3 | 6 |  |  |  |  |
| 49 | 11 | 14 |  |  |  |  |
| 50 | 3 | 5 |  |  |  |  |
| 51 | 11 | 12 |  |  |  |  |
| 52 | 3 | 3 |  |  |  |  |
| 53 | 10 | 10 |  |  |  |  |
| 54 | 1 | 1 |  |  |  |  |
| 55 | 9 | 7 |  |  |  |  |
| 56 | 15 | 14 |  |  |  |  |
| 57 | 7 | 4 |  |  |  |  |
| 58 | 13 | 10 |  |  |  |  |
| 59 | 4 | 0 |  |  |  |  |
| 60 | 10 | 6 |  |  |  |  |
| 61 | 0 | 11 |  |  |  |  |
| 62 | 6 | 0 |  |  |  |  |
| 63 | 12 | 5 |  |  |  |  |
| 64 | 1 | 10 |  |  |  |  |
| 65 | 7 | 15 |  |  |  |  |
| 66 | 12 | 4 |  |  |  |  |
| 67 | 1 | 8 |  |  |  |  |
| 68 | 7 | 12 |  |  |  |  |
| 69 | 11 | 0 |  |  |  |  |
| 70 | 0 | 4 |  |  |  |  |
| 71 | 5 | 8 |  |  |  |  |
| 72 | 9 | 11 |  |  |  |  |
| 73 | 13 | 15 |  |  |  |  |
| 74 | 1 | 2 |  |  |  |  |
| 75 | 5 | 5 |  |  |  |  |
| 76 | 9 | 8 |  |  |  |  |
| 77 | 12 | 11 |  |  |  |  |
| 78 | 15 | 13 |  |  |  |  |
| 79 | 3 | 0 |  |  |  |  |
| 80 | 6 | 2 |  |  |  |  |
| 81 | 9 | 4 |  |  |  |  |
| 82 | 12 | 6 |  |  |  |  |
| 83 | 14 | 7 |  |  |  |  |
| 84 | 0 | 8 |  |  |  |  |
| 85 | 3 | 10 |  |  |  |  |
| 86 | 5 | 10 |  |  |  |  |
| 87 | 7 | 11 |  |  |  |  |
| 88 | 9 | 12 |  |  |  |  |
| 89 | 10 | 13 |  |  |  |  |
| 90 | 11 | 13 |  |  |  |  |
| 91 | 12 | 14 |  |  |  |  |
| 92 | 13 | 14 |  |  |  |  |
| 93 | 14 | 14 |  |  |  |  |
| 94 | 15 |  |  |  |  |  |
| 95 | 0 |  |  |  |  |  |
| 96 | 0 |  |  |  |  |  |
| 97 | 1 |  |  |  |  |  |
| 98 | 1 |  |  |  |  |  |
| 99 | 1 |  |  |  |  |  |
| 100 | 2 |  |  |  |  |  |

TABLE 13

First and Last Carrier Indexes for each band

|  | $C_{n1}$ | $C_{n2}$ |
|---|---|---|
| FCC | 3 | 102 |
| ARIB | 3 | 95 |
| CELENEC-A | 2 | 20 |
| CELENEC-B | 21 | 26 |
| CELENEC-C | 27 | 29 |
| CELENEC-BC | 21 | 29 |

Figure 11B:
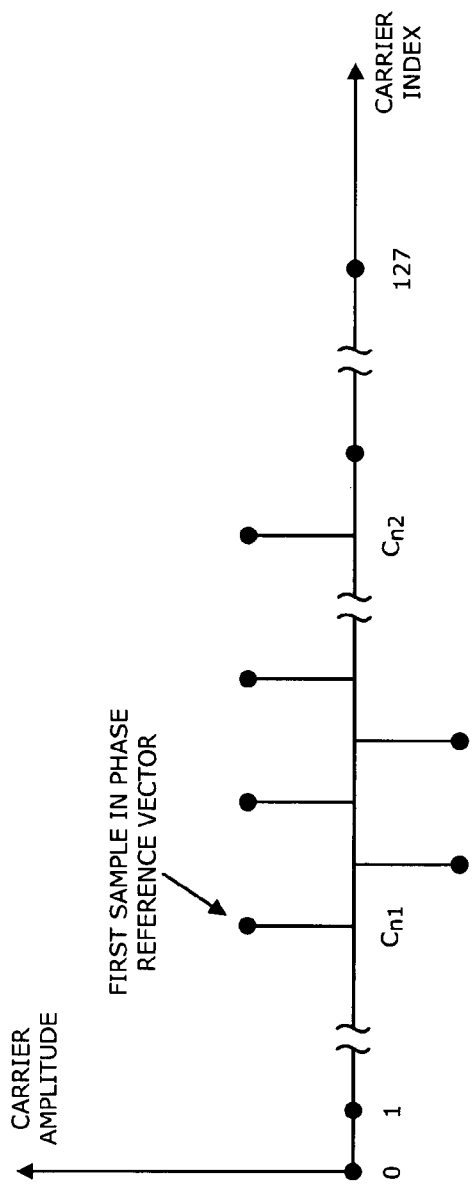
FIG. 11B is a diagram illustrating the carrier index numbers according to one embodiment.

FIG. 11B is a diagram illustrating the carrier index numbers according to one embodiment.

Figure 11C:
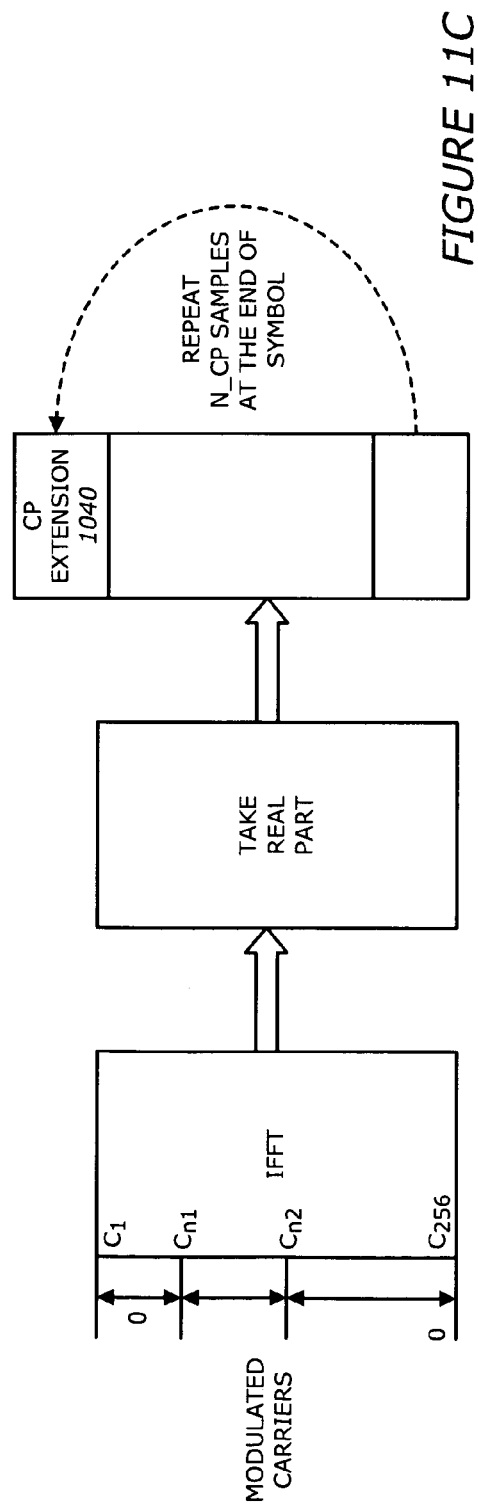
FIG. 11C is a diagram illustrating the input/output configuration according to one embodiment.

The IFFT 1030 may take the 256-point IFFT of the input vector and may generate the main 256 time domain OFDM words preceded by N_CP words of cyclic prefix. In other words, the last N_CP samples at the output of the IFFT 1030 may be taken and placed in front of symbol. The useful output may be the real part of the IFFT coefficients. FIG. 11C is a diagram illustrating the input/output configuration according to one embodiment. The first carrier $C_{n1}$ and the last carrier index $C_{n2}$ associated with each band may be given in Table 13.

Figure 12:
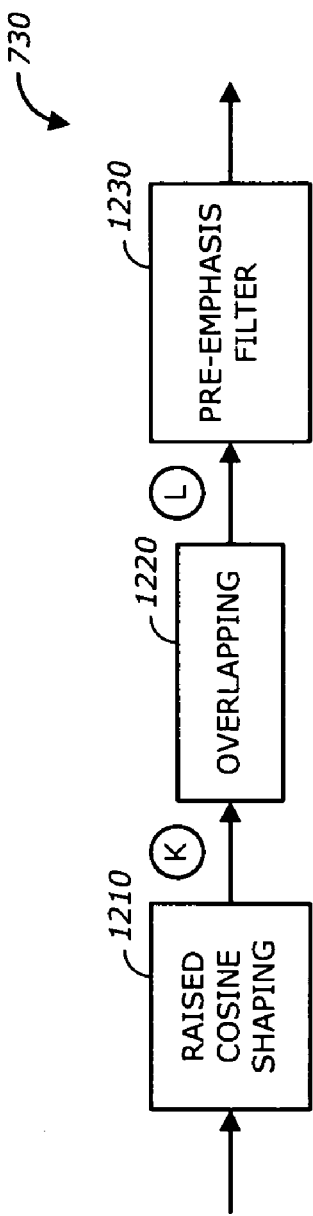
FIG. 12 is a diagram illustrating the PSD shaping module according to one embodiment.

FIG. 12 is a diagram illustrating the PSD shaping module 730 according to one embodiment. The PSD shaping module 730 includes a raised cosine shaping 1210, an overlapping 1220, and a pre-emphasis filter 1230.

Figure 13A:
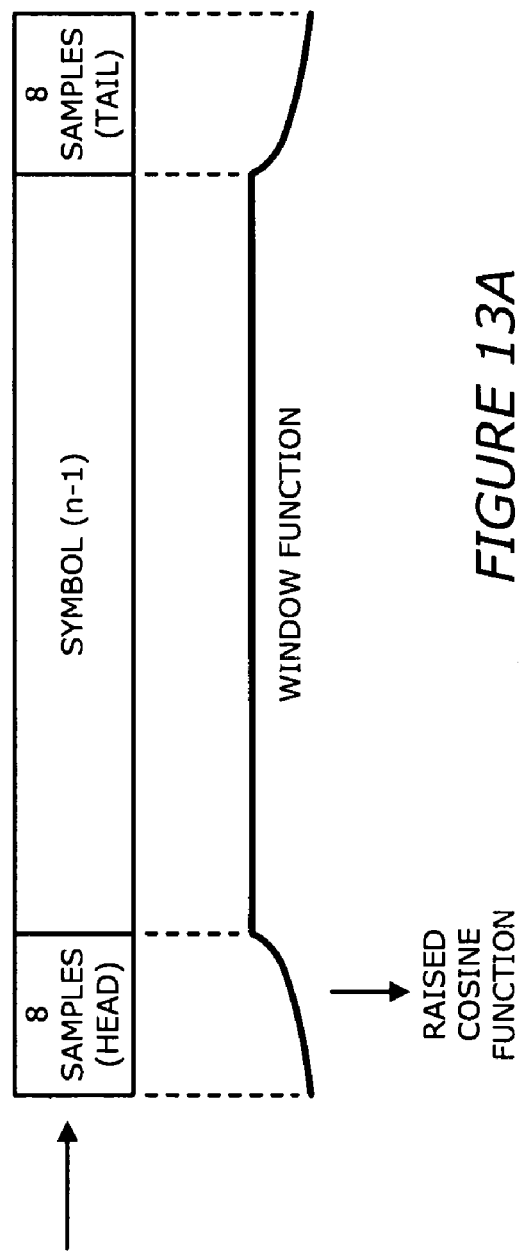
FIG. 13A is a diagram illustrating a raised cosine function according to one embodiment.
Figure 13B:
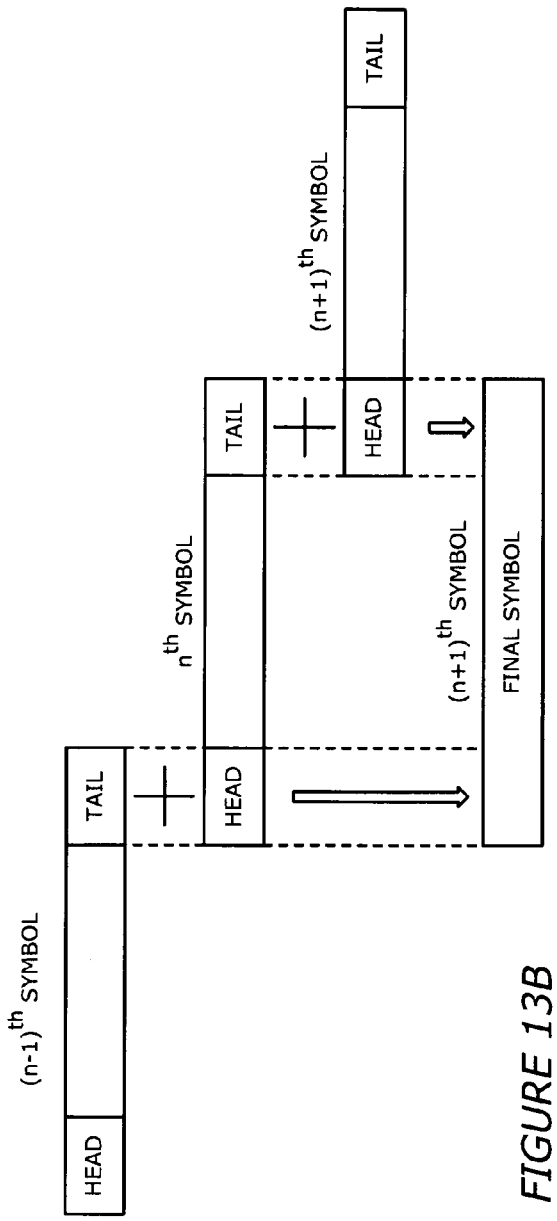
FIG. 13B is a diagram illustrating a overlapping and add operation according to one embodiment.

FIG. 13A is a diagram illustrating a raised cosine function according to one embodiment. FIG. 13B is a diagram illustrating a overlapping and add operation according to one embodiment.

In order to reduce the out of band emission and to reduce the spectral side lobe, a window function may be applied. In one embodiment, the Raised Cosine shaping 1210 may be applied to all the data symbols. Then the tails and heads of successive symbols may be overlapped and added together by the overlapping 1220. This process is described below. Each side of a symbol may be first shaped by the raised cosine function as shown in FIG. 13A.

The windowing function at each 8-sample boundary may be a Raised Cosine function and its values are given in Table 14. The window function may have a value equal to one at other samples. Then the 8 tail and 8 head shaped samples of the symbol from each side of symbol may be overlapped with the tail and head samples of adjacent symbols as shown in FIG. 13B. In other words, In order to construct the $n_{th}$ symbol, firstly its 8 head samples may be overlapped with the 8 tail samples of the $(n-1)_{th}$ symbol and its 8 tail samples may be overlapped with the 8 head samples of the $(n+1)_{th}$ symbol. Finally, the corresponding overlapped parts may be added together. Note that the head of the first symbol is overlapped with the tail of preamble. And the tail of last symbol may be sent out with no overlapping applied.

TABLE 14

The Raised Cosine Samples

| | Head samples | Tail samples |
|---|---|---|
| 1 | 0 | 0.9619 |
| 2 | 0.0381 | 0.8536 |
| 3 | 0.1464 | 0.6913 |
| 4 | 0.3087 | 0.5000 |
| 5 | 0.5000 | 0.3087 |
| 6 | 0.6913 | 0.1464 |
| 7 | 0.8536 | 0.0381 |
| 8 | 0.9619 | 0 |

Figure 14:
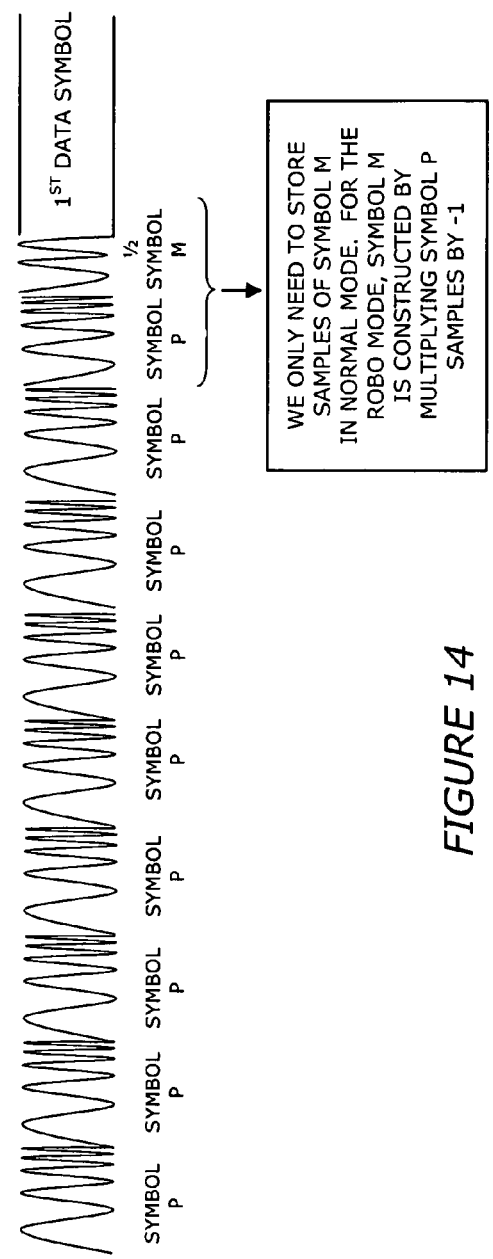
FIG. 14 is a diagram illustrating a preamble signal according to one embodiment.

FIG. 14 is a diagram illustrating a preamble signal according to one embodiment.

Memory locations may need to be allocated in the baseband to store the preamble samples. The preamble samples may be prepared in advance and download into the baseband memory during initialization period by the processor that implements the MAC layer. Each sample of preamble symbol may have an 8-bit length. The preamble signal that may be added to the beginning of each PHY frame may be shown in FIG. 14. It may include 8 symbols of type P and 1.5 symbols of type M. The total number of samples may be equal to 2432 samples. The first and the last 8 samples may be shaped according to Raised Cosine window. Note that the last 8 samples may be overlapped by the first 8 samples of the first data symbol. In practice we only need to store 256 sample of symbol P, 256 samples of symbol M, the first and the last 8 samples. Note that the symbol M may be different in Normal mode from that in the ROBO mode. In the ROBO mode, symbol M may be signed reversed of the P symbol, so there may be no extra storage required to store another symbol M for ROBO mode. In normal mode, the M symbol may have 90° phase shift from the P symbol.

Figure 15:
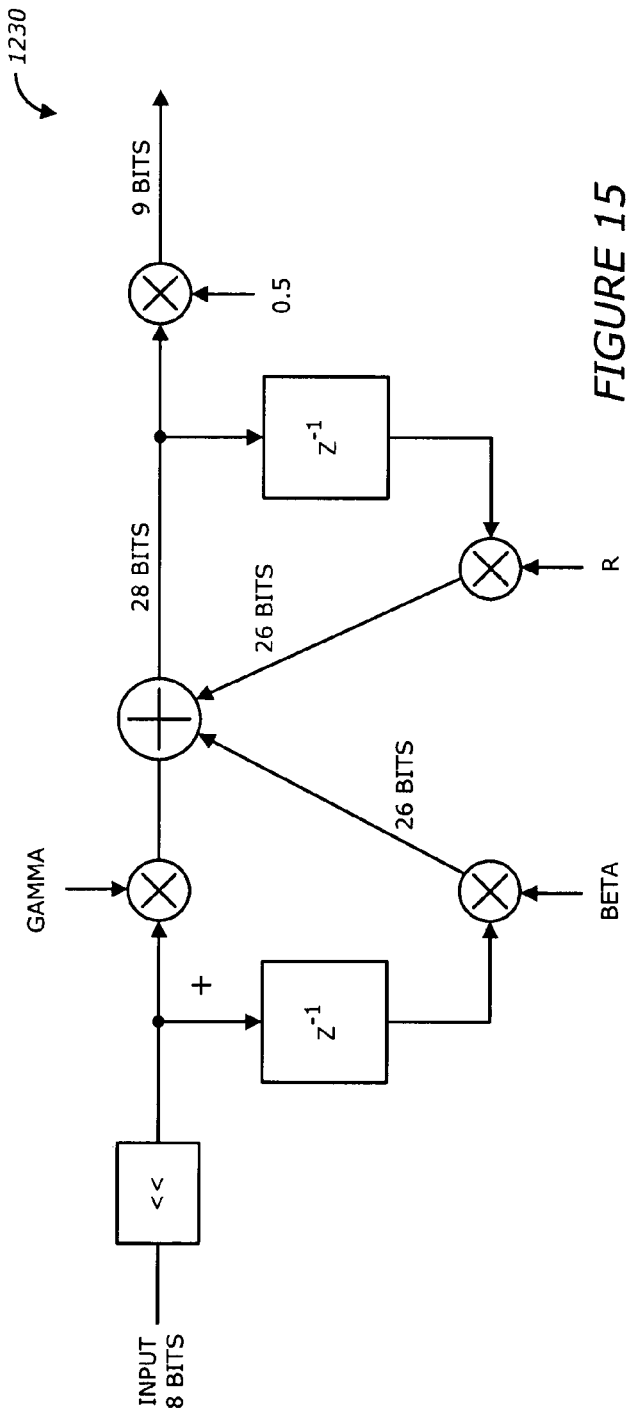
FIG. 15 is a diagram illustrating the pre-emphasis filter according to one embodiment.

FIG. 15 is a diagram illustrating the pre-emphasis filter 1230 according to one embodiment.

Time-Domain Pre-Emphasis Filter:

A time-domain pre-emphasis filter 1230 may be a linear equalization method where the transmit signal spectrum may be shaped to compensate for amplitude distortion. The purpose of this filter may be to provide frequency shaping to the transmit signal in order to compensate for attenuation introduced to the signal as it goes through the power line.

The pre-emphasis filter 1230 may be a first order recursive filter with transfer function of $H(z)=0.5*[(Gamma+Beta*z\hat{0}-1)/(1-R*z\hat{0}-1)]$. It may be specified with below deference equation:

$$y(n)=0.5*[Gamma*x(n)+Beta*x(n-1)+R*y(n-1)]$$

As shown, the pre-emphasis filter 1230 may have one zero and one pole. In this implementation Gamma, Beta, and R may be programmable and may be assigned 16-bit registers. The pre-emphasis filter 1230 may be the last block in the transmit path right before the output formatter 750. The pre-emphasis filter may have the following register requirements: an enable/disable bit to enable/bypass the pre-emphasis filter, a Gamma register (signed 16 bits): parameter to control the shape of the pre-emphasis filter, a Beta register (signed 16 bits): parameter to control the shape of the pre-emphasis filter, and an R register (signed 16 bits): parameter to control the shape of the pre-emphasis filter.

Figure 16:
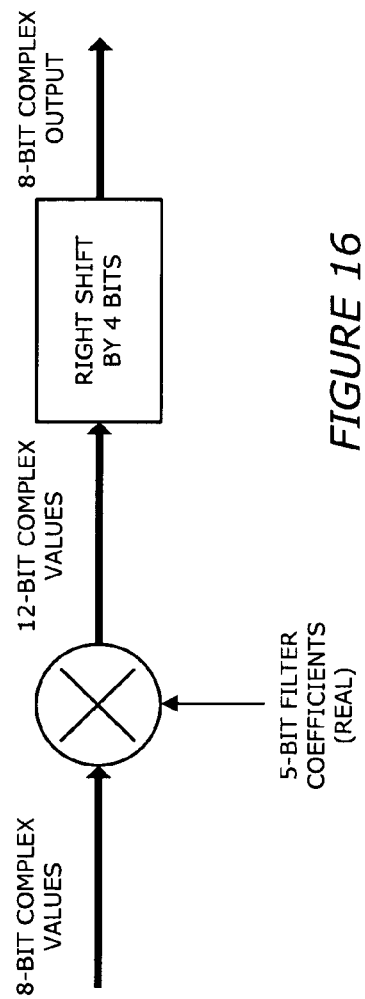
FIG. 16 is a diagram illustrating the pre-emphasis filter according to one embodiment.

Frequency Domain Pre-Emphasis Filter:

FIG. 16 is a diagram illustrating the pre-emphasis filter according to one embodiment. The purpose of this block may be to provide frequency shaping to the transmit signal in order to compensate for attenuation introduced to the signal as it goes through the power line.

The frequency-domain pre-emphasis filter may include of a multiplier that may multiply the complex frequency domain samples of an OFDM symbol with 128 real filter coefficients, then do four right shifts at the output. The filter coefficients may be 5 bits representing unsigned values from 0 h to 10 h. The filter coefficients may not be allowed to have values larger than 10 h. The filter may multiply the first 128 frequency-domain complex samples of an OFDM symbol with the 128 real coefficients of the filter. The rest of the 128 frequency-domain samples of the OFDM symbol may be usually set to zero and may not be multiplied by the filter coefficients. As the block diagram below shows, the input complex samples may be 8 bits each while the filter coefficients may be 5 unsigned bits each. Since the maximum allowed value of any filter coefficients may be 10 h, the output of the multiplication may be 12 bits (not 13 bits). The output may then be right shifted by 4 to get a final output of 8 bits that may be used as input to the IFFT.

The filter coefficient values may vary from 0 to 16, and since we do 4 right shifts at the output, it follows that the filter may provide the following attenuation for any of the 128 carriers:

| Scaling factor | attenuation in dB |
|---|---|
| 16/16 | 0 dB |
| 15/16 | −0.53 dB |
| 14/16 | −1.16 dB |
| 13/16 | −1.8 dB |
| 12/16 | −2.5 dB |
| 11/16 | −3.25 dB |
| 10/16 | −4 dB |
| 9/16 | −5 dB |
| 8/16 | −6 dB |
| 7/16 | −7.2 dB |
| 6/16 | −8.5 dB |
| 5/16 | −10.1 dB |
| 4/16 | −12 dB |
| 3/16 | −14.5 dB |
| 2/16 | −18 dB |
| 1/16 | −24 dB |
| 0/16 | −infinite |

The following registers may be needed to control the frequency-domain pre-emphasis filter: Enable/Disable bit: Allows for enabling/disabling the filter.

Transmitter (TX) P and D Scaler:

In order to control the transmitted power level of P and M in relation to power level of data two scalers may be implemented in the transmitter: a Data scaler to scale the data, and a P/M scaler to control the levels of the P & M that we are now generating from the frequency domain using the IFFT. Both scalers may be described below. On the receiver path, no scaling may be needed.

Figure 17A:
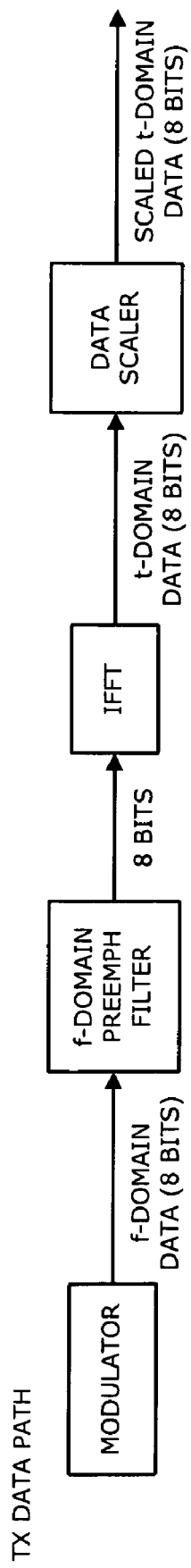
FIG. 17A is a diagram illustrating a data scaler on the transmitter data path according to one embodiment.
Figure 17B:
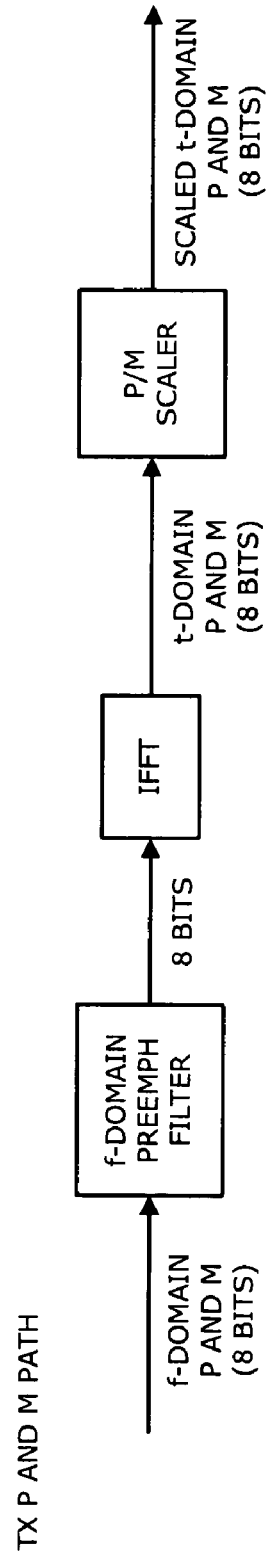
FIG. 17B is a diagram illustrating a P and M scaler on the transmitter data path according to one embodiment.
Figure 17C:
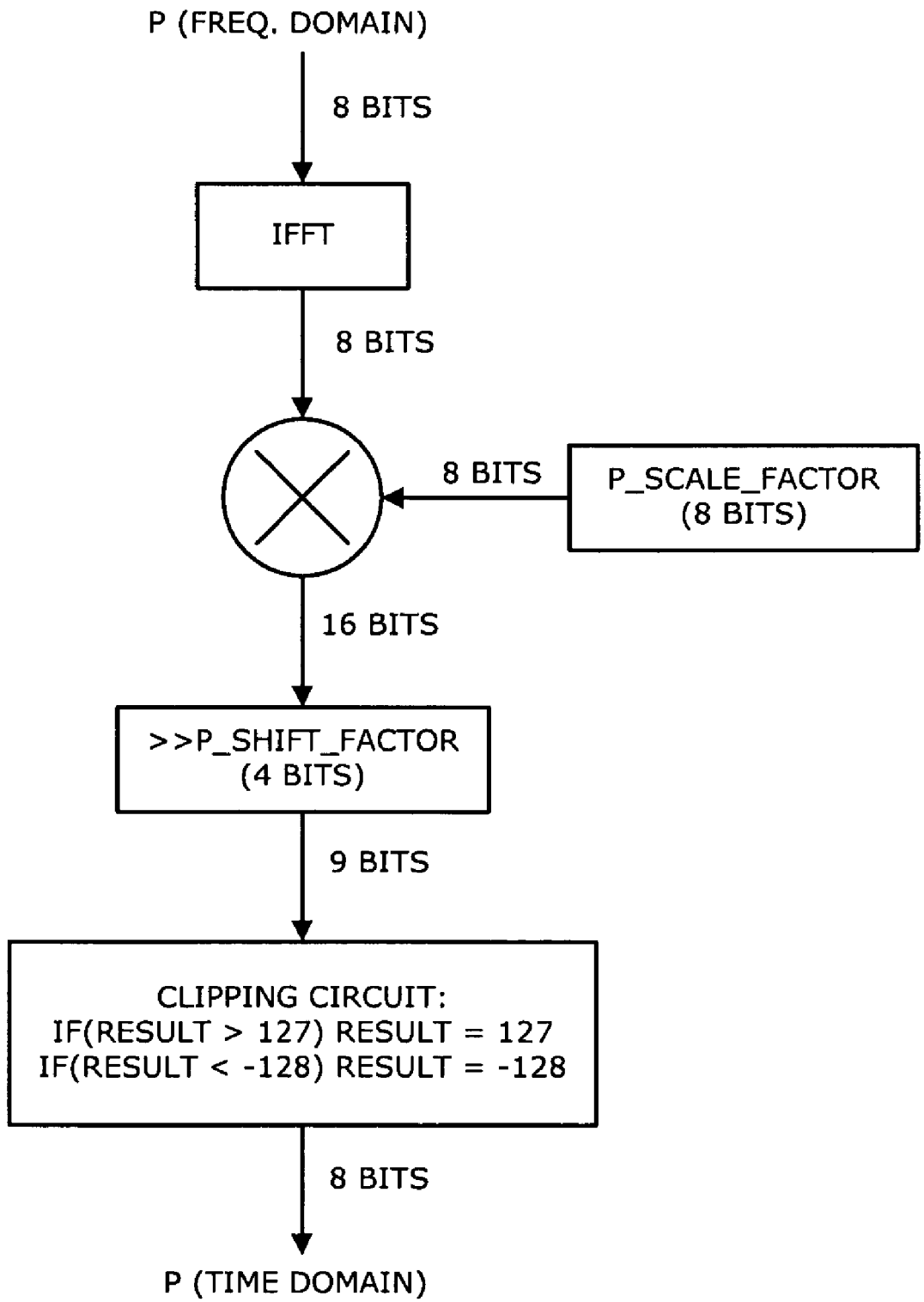
FIG. 17C is a diagram illustrating a scaler for frequency-domain P and M signals according to one embodiment.

FIG. 17A is a diagram illustrating a data scaler on the transmitter data path according to one embodiment. FIG. 17B is a diagram illustrating a P and M scaler on the transmitter data path according to one embodiment. FIG. 17C is a diagram illustrating a scaler for frequency-domain P and M signals according to one embodiment. FIGS. 17A and 17B are provided to show how the 4-bit sync reference may be generated and scaled. The P/M scaler is used to scale IFFT output of frequency-domain P and M so that their levels may be as close as possible to original time-domain P & M. Once that is accomplished, the data scaler is used to achieve the desired P/Data RMS ratio. In what follows, the P/M scaler is described first, followed by the data scaler, which may have an identical architecture.

FIG. 17C shows how the IFFT output of frequency-domain P and M may be scaled so that their levels may be as close as possible to original time-domain P & M. This block may be called the "P/M Scaler". The table lists the values for P_scale_factor and P_shift_factor registers for the different wideband and narrowband standards.

The data scaler may have identical block to the P/M scaler except that P_scale_factor is renamed to Data_scale_factor, and P_shift_factor is renamed to Data_shift_factor, where both may remain 8 bits each. The table shows the default values for the data scalers for the different standards.

FIG. 18 is a diagram illustrating a receiver 1800 according to one embodiment. The receiver 1800 includes a data formatter 1810, a direct current (DC) blocker 1815, an analog automatic gain control (AGC) processor 1820, a processing unit 1830, a digital AGC processor 1840, a demodulator 1850, a symbol synchronizer 1852, a frame synchronizer 1854, a preamble FFT coefficient buffer 1860, a mode detector 1870, and a FEC decoding unit 1880. It is noted that the receiver 1880 may include more or less than the above elements. In addition, any one of the above elements may be implemented by hardware, software, firmware, or any combination of hardware, software, and firmware.

Figure 19:
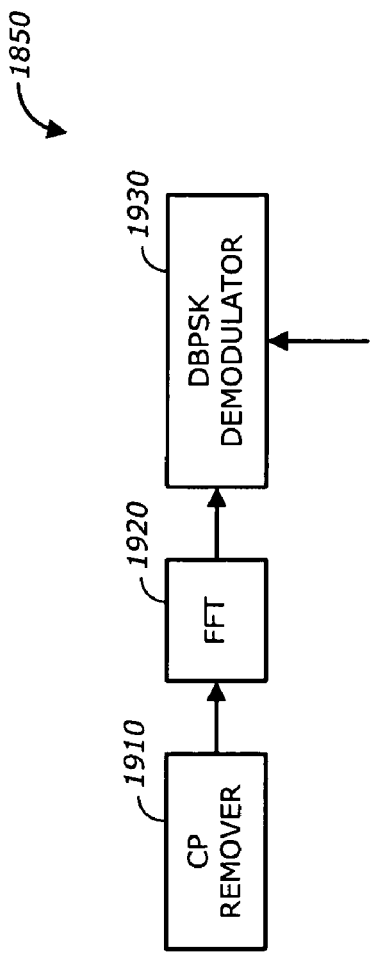
FIG. 19 is a diagram illustrating the demodulator according to one embodiment.

FIG. 19 is a diagram illustrating the demodulator 1850 according to one embodiment. The demodulator 1850 includes a cyclic prefix (CP) remover 1910, a FFT processor 1920, and a DBPSK demodulator 1930.

Figure 20:
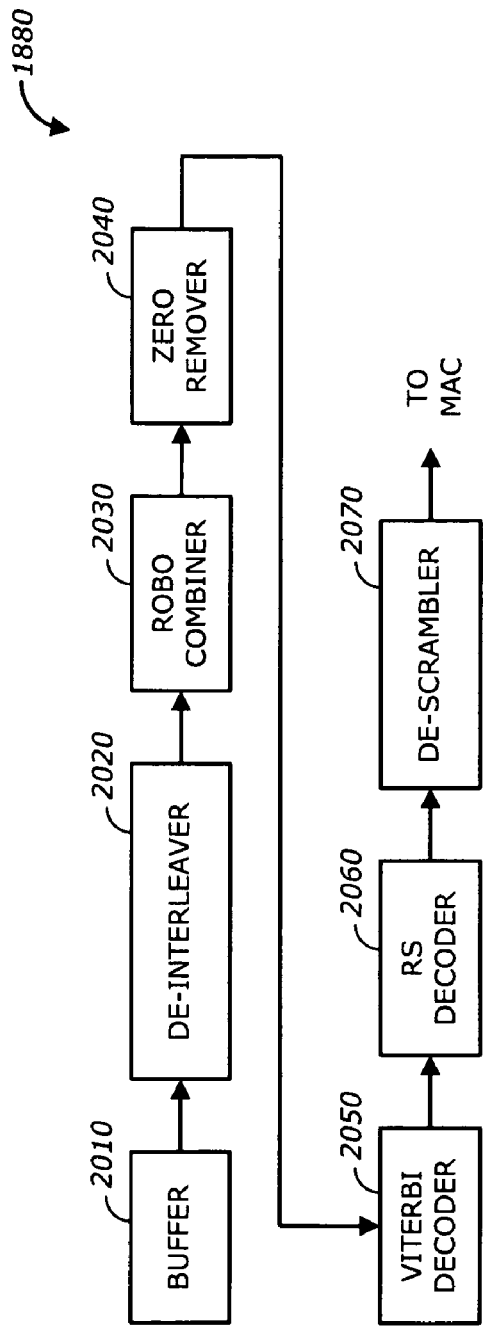
FIG. 20 is a diagram illustrating the FEC decoding unit according to one embodiment.

FIG. 20 is a diagram illustrating the FEC decoding unit 1880 according to one embodiment. The FEC decoding unit 1880 includes a buffer 2010, a de-interleaver 2020, a ROBO combiner 2030, a zero remover 2040, a Viterbi decoder 2050, a RS decoder 2060, and a descrambler 2070. It is noted that the FEC decoding unit 1880 may include more or less than the above elements. In addition, any one of the above elements may be implemented by hardware, software, firmware, or any combination of hardware, software, and firmware.

On the receiver side, the PHY layer may receive its input samples from the power line and may hand the demodulated data bits over to the MAC layer. The processing unit 1830 may include a first infinite impulse response (IIR) filter 1832, a second IIR filter 1834, a jammer canceller 1836, and a root mean square (RMS) module 1838. The jammer canceller 1836 removes interference or a jamming signal in the input signal. The symbol synchronizer 1852 and the frame synchronizer 1854 may be used for preamble (ACK signal) detection, symbol and frame synchronization. The frame synchronizer 1854 and the preamble FFT coefficient buffer 1860 may be used to perform the initial preamble phase and the channel estimation, respectively.

The synchronizers 1852 and 1854 and the jammer canceller 1836 may be ON when the system is in the "Receive" mode. If the jammer or interfering signal may be present in the channel and detected, a switch may be set so that the signal may be taken from the output of the jammer canceller 1836. The jammer detector in the jammer canceller 1836 may do this automatically. The mode detector 1870 detects the mode of operation and sets an ACK flag 1872 or a ROBO flag 1874 as appropriate.

Two different synchronizer circuits, one for FCC, ARIB and CENELEC bands (Wideband OFDM) and another for CENELEC B, C and BC (Narrow band OFDM), may be used for different bands. The tasks for synchronizers may be the detection of preamble and obtaining the start of preamble symbol (symbol synchronizer) and the start of data symbol (frame synchronizer). As soon as the start of data symbol may be found, a switch may be moved to place the CP remover in the demodulator 1850 (FIG. 19) in the signal path. At the same time a timer 1865 may be enabled to generate the Physical Carrier Sense (PCS) signal. This signal may be high for the entire frame period. It may be at the end of PCS signal that the ACK flag 1872 and the ROBO flag 1874 are reset. Note that same waveforms may be used for ACK signaling and therefore as soon as the preamble is detected the ACK flag 1872 may be set. The value of this flag may be read by the MAC software and may be reset at the end of PCS signal. Note that the frame synchronizer 1854 may also detect if the PHY frame may be in ROBO mode or in Normal mode accordingly set/reset the ROBO flag 1874.

Once the symbol synchronizer identifies the start of preamble symbols, the initial channel estimator may be activated. At this time a switch may be set since there may be no cyclic prefix extension for preamble symbols. This block may measure the reference phase from the preamble. It may also measure the channel quality at each frequency bin. The channel estimator may also estimate the SNR for each carrier.

The ROBO flag 1874 may select the position of a switch in the FEC decoding unit 1880. Depending on the preamble waveform, the frame synchronizer 1854 may identify if the frame is in ROBO mode or in Normal Mode and the switch in the FEC decoding unit 1880 is set accordingly.

Figure 21:
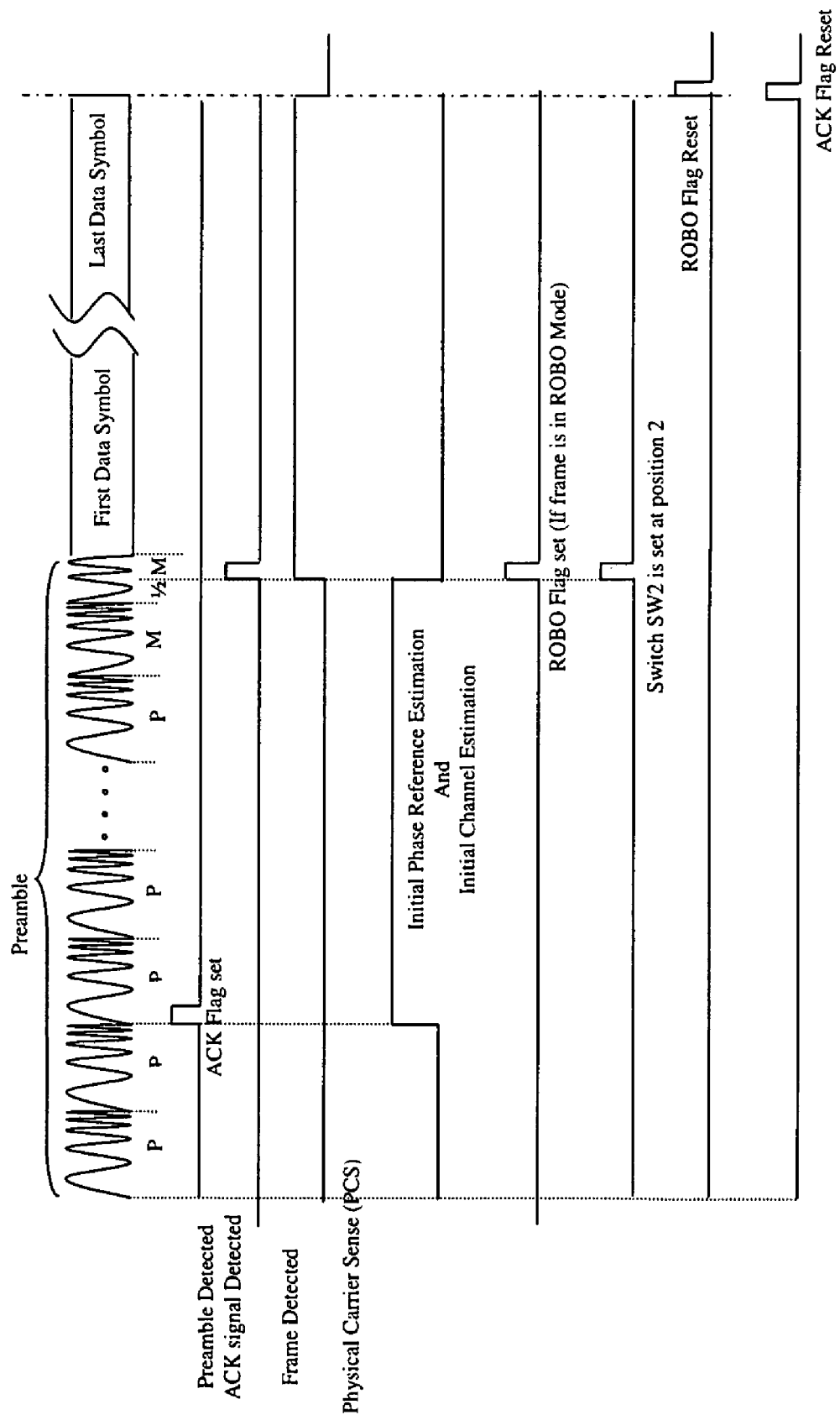
FIG. 21 is a diagram illustrating timings associated with events in the receiver according to one embodiment.

FIG. 21 is a diagram illustrating timings associated with events in the receiver according to one embodiment.

Figure 22:
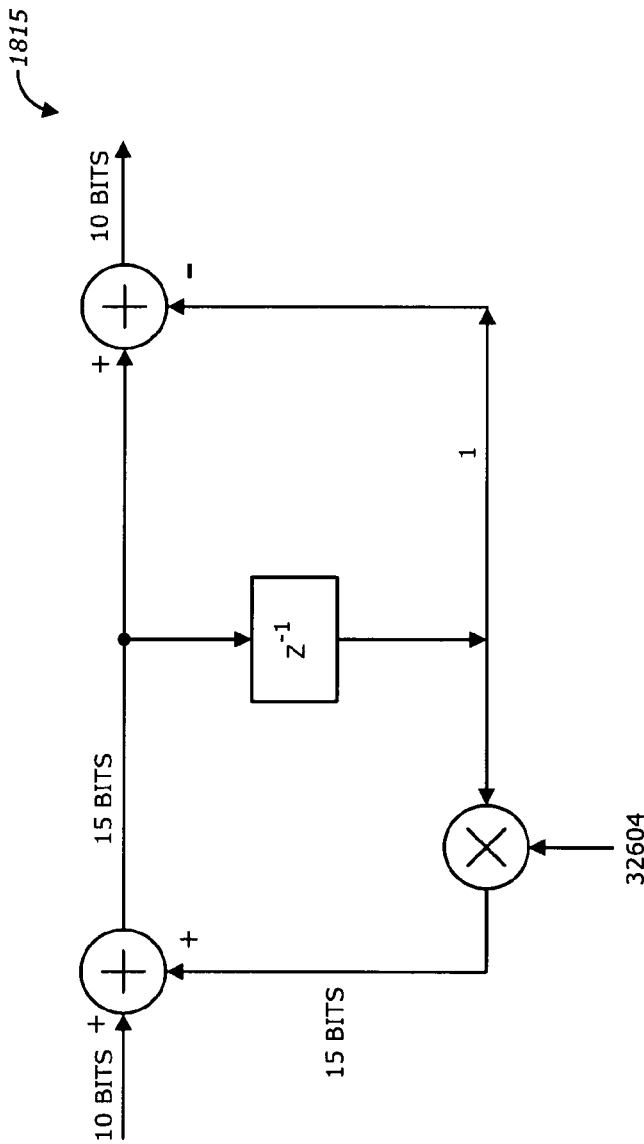
FIG. 22 is a diagram illustrating the DC blocker according to one embodiment.

The data formatter 1810 may take the data bits from the analog-to-digital converter (ADC) and may perform tasks including, scaling, and mapping to convenient signed value representation. The DC blocker 1815 may be used to remove the DC component of incoming data. Since A/D converters and analog front-end circuitry may not be expected to be totally DC free, this filter may remove the DC residual. FIG. 22 is a diagram illustrating the DC blocker 1815 according to one embodiment. The DC blocker 1815 may be a first order recursive filter with transfer function of $H(z)=1-z^{-1}/1-Az^{-1}$. It may be specified with the deference equation $y(n)=x(n)-x(n-1)+Ay(n-1)$. DC blocker may have a zero at DC ($z=1$) and a pole near DC at $z=A$. In order to have the pole and zero cancel each other A may be selected as close as possible to unit circle. In one embodiment, $A=0.995*2^{15}=32604$. The DC blocker 1815 may be the first block in receiver path before jammer canceller 1836. An enable/disable register may be allocated for the DC blocker 1815.

Figure 23:
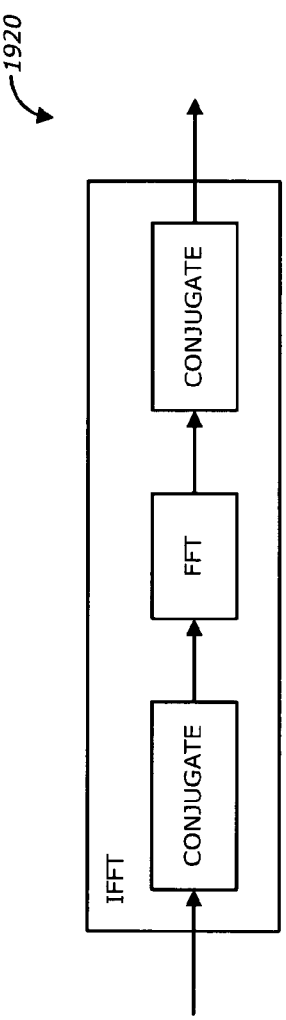
FIG. 23 is a diagram illustrating the FFT according to one embodiment.

FIG. 23 is a diagram illustrating the FFT 1920 according to one embodiment. The same structure as used for the IFFT in the transmitter is used for FFT as well.

Figure 24:
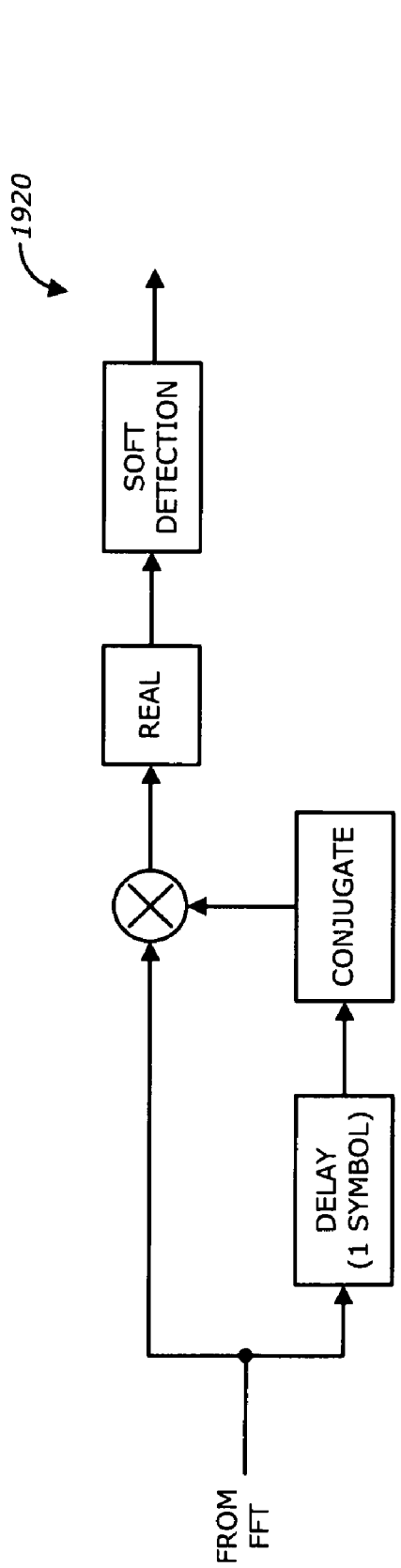
FIG. 24 is a diagram illustrating the DBPSK demodulator according to one embodiment.

FIG. 24 is a diagram illustrating the DBPSK demodulator 1930 according to one embodiment. The phase difference between carriers over successive symbols may be estimated after the FFT of the current symbol may be multiplied by the conjugate values of the FFT of the previous symbol. The size of the signal at each node in FIG. 4.15 may be equal to the number of carriers (Ncarr). The real value of the signal at the output of multiplier may be taken and quantized appropriately by soft detection block. Each bit (carried by each carrier) may be represented by an integer number. The value of this number may depend on the reliability of the bit. The length of this integer number may be provided in fixed-point implementation.

The bit de-interleaver 2020 may reverse the mappings described in the transmitter section.

Figure 25:
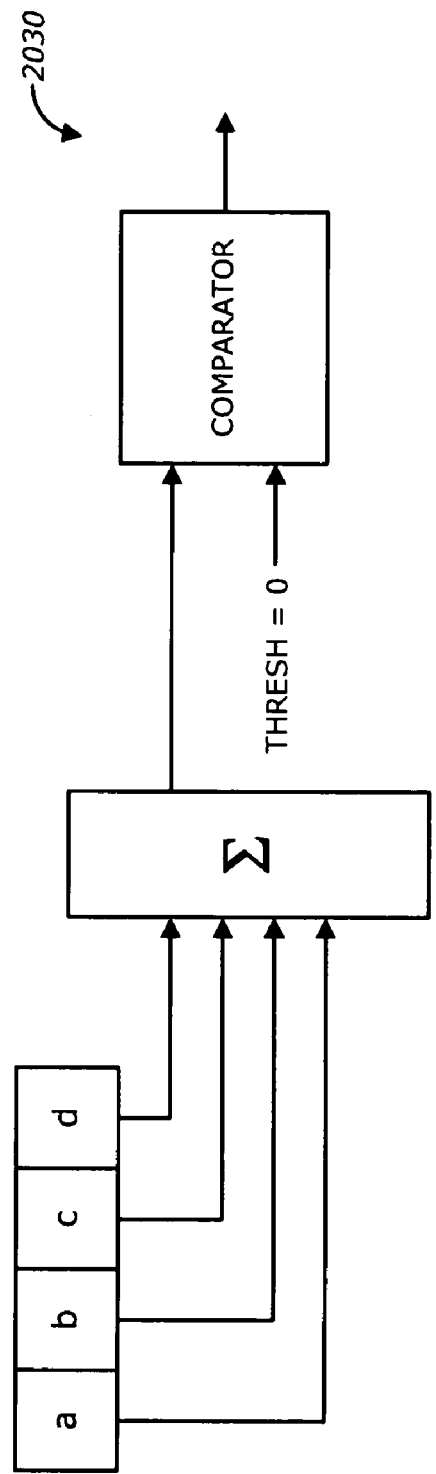
FIG. 25 is a diagram illustrating the ROBO combiner/decoder according to one embodiment.

FIG. 25 is a diagram illustrating the ROBO combiner/decoder 2030 according to one embodiment. In ROBO mode, the encoded data may be extended 4 times by parity bits. For the repeat code, the soft values for each demodulated carrier are obtained. Then all the four values associated with one data bit may be averaged prior to hard decoding.

The errors at the output of Viterbi decoder tend to occur in a burst fashion. To correct these burst errors a RS code may be concatenated with convolutional code.

Figure 26:
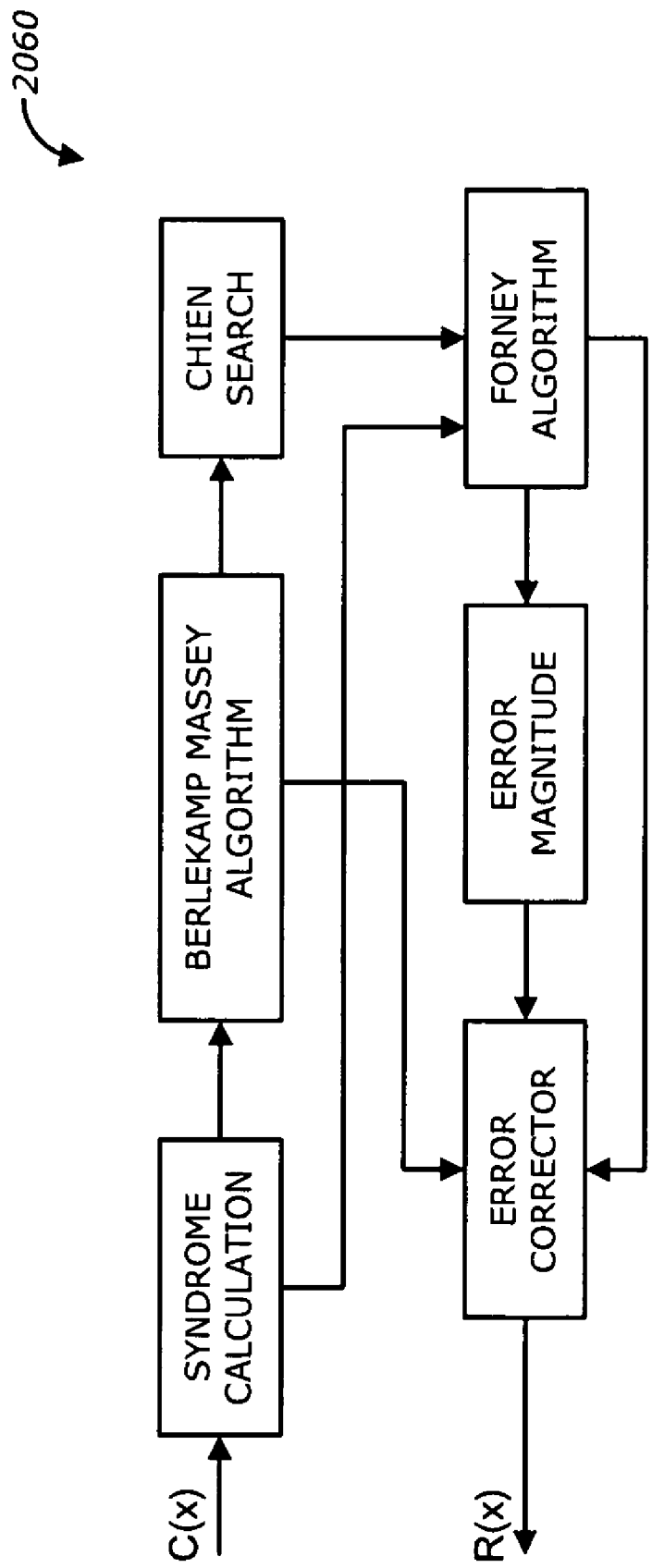
FIG. 26 is a diagram illustrating the RS decoder according to one embodiment.

FIG. 26 is a diagram illustrating the RS decoder 2060 according to one embodiment.

The de-scrambler 2070 may reverse the scrambling action, done on the source information bits in the transmitter.

The analog and digital Automatic Gain Control (AGC) is used to adjust the received signal to a pre-determined level and reduce any variations in its level. It includes an analog AGC block that does the preliminary gain level adjustment followed by a digital AGC block that makes additional and more refined adjustments.

The benefits of this system may include: (1) preventing significant fluctuations in the received signal level which can significantly degrade the performance of the receiver; (2) significantly increasing the dynamic range of the system; and (3) tracking signal variation and normalizing the received signal to within a predetermined bit size. In general, the combined analog and digital AGC may include two components: an analog AGC block and a digital AGC block, both working in a cascaded structure in order to control the received signal level. The analog AGC block is a feedback system where the energy at the output of the block is computed and used to adjust the gain of the block. It is followed by a digital AGC block which is a feed-forward system where the energy at the input to the digital AGC (which is the output from the analog AGC after it possibly goes through a processing unit which may include a jammer canceller) is computed and used to control the gain of the digital AGC. The desired gains of the analog and digital blocks are computed by normalizing the computed energies and the desired energies of the respective blocks. Then for each block the difference between the two is computed and that value is used to specify how to scale (e.g., right or left shifts) the input samples of that block. This difference value may be rounded to the nearest $2^P$, where P is a non-negative integer, and the resultant P is divided by two and used to specify the amount of right or left shift. In one embodiment, the difference may be computed by normalizing the desired energy with the computed energy, ie.g., dividing the desired energy by the computed energy. Doing this eliminates the need to take the square root of the two quantities and dividing them by each other, and hence significantly reduces the hardware needed to implement the two blocks.

The combined analog and digital AGC may perform at least one of the following operations or have the following characteristics:

Combining an analog AGC that is implemented using a feedback mechanism with a digital AGC that is implemented using a feed-forward structure.

Significantly reducing the hardware required to implement the AGC by computing the desired gain for each block using the normalization method as opposed to taking the square root of the computed energy and desired energy of each block then dividing them by each other.

Inserting an analog band-pass IIR filter in front of the analog AGC in order to reduce out-of-band noise in the signal at the input of the analog AGC, which results in significantly less fluctuations in the computed energy values and hence results in more stable computed gain values for the analog AGC.

Inserting a digital band-pass (e.g., biquad IIR) filter after the analog AGC and before the digital AGC in order to reduce out-of-band noise in the signal at the input of the digital AGC, which results in significantly less fluctuations in the computed energy values and hence results in more stable computed gain values for the digital AGC.

Inserting a jammer canceller between an analog and a digital AGC so that the digital AGC is used to compensate for any attenuation in its input signal resulting from the jammer canceller canceling possible interference in the signal.

Using an external signal to control when to freeze/unfreeze the AGC, where freezing the AGC means keeping the gain of the AGC unchanged and stopping the computation of any new gain for the analog and digital blocks until the external signal is reset to indicate unfreezing the AGC.

Using two independent external signals where one signal is used to freeze/unfreeze the analog AGC block while the second external signal is used to freeze/unfreeze the digital AGC block.

Tracking signal variation and normalizing the received signal to the proper bit size needed for error correction to operate in optimum way.

Figure 27:
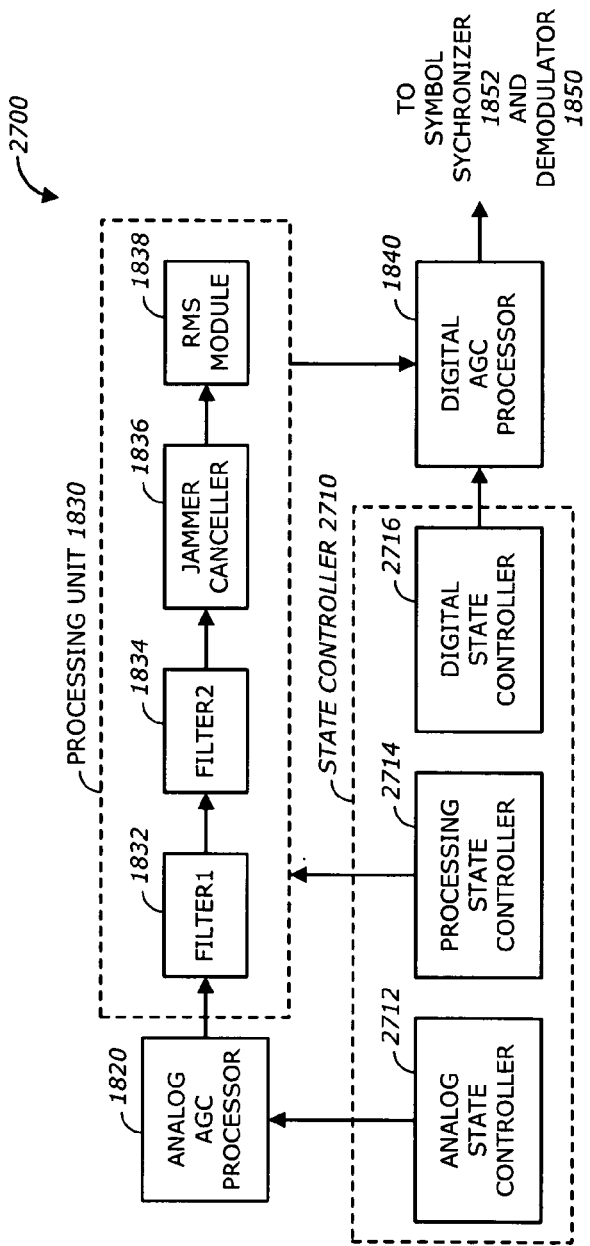
FIG. 27 is a diagram illustrating the combined analog and digital AGC according to one embodiment.

FIG. 27 is a diagram illustrating the combined analog and digital AGC 2700 according to one embodiment. The analog and digital AGC 2700 includes an analog AGC processor 1820, a processing unit 1830, a digital AGC processor 1840, and a state controller 2710. Part of the analog and digital AGC 2700 is shown in FIG. 18. It is noted that the analog and digital AGC 2700 may include more or less than the above elements. In addition, any one of the above elements may be implemented by hardware, software, firmware, or any combination of hardware, software, and firmware The analog AGC processor 1820 control an analog adjustable gain of an input signal using a feedback mechanism. The analog AGC processor 1820 generates a first signal. The processing unit 1830 transforms the first signal into a second signal. The transformation may include any of the following operations: filtering (e.g., noise rejecting), jammer cancelling, energy computation). The processing unit 1830 may include one or more of the following components: a first filter 1832, a second filter 1834, a jammer canceller 1836, and a RMS module 1838. It is noted that the processing unit 1830 may not be needed in which case the output of the analog AGC processor 1820 may go directly to the input of the digital AGC processor 1840. The digital AGC processor 1840 controls a digital adjustable gain of the second signal using a feed-forward mechanism. The output of the digital AGC processor 1840 may go to the other sections of the receiver such as the symbol synchronizer 1852 and/or the demodulator 1850. The state controller 3410 performs various control functions to the analog AGC processor 1820, the processing unit 1830, and the digital AGC processor 1840. The state controller 2710 may generate a sequence of commands to the various components to avoid entering a hysteresis state where the analog PGA and the digital PGA blocks operate out of sync with each other. The state controller 2710 includes an analog state controller 2712 to control state of the analog AGC processor 1820, a processing state controller 2714 to control state of the processing circuit 1830, and a digital state controller 2716 to control state of the digital AGC processor 1840. In one embodiment, the analog state controller 2712 generates an analog control signal to freeze and unfreeze the analog AGC processor 1820. The digital state controller 2716 generates a digital control signal to freeze and unfreeze the digital AGC processor 1840. The digital control signal may be generated independently from the analog control signal. It is noted that freezing an AGC processor means keeping the gain of the AGC unchanged and stopping the computation of any new gain for the AGC processor until the corresponding external signal is reset to indicate unfreezing the AGC. Unfreezing means removing the freezing condition.

Figure 28:
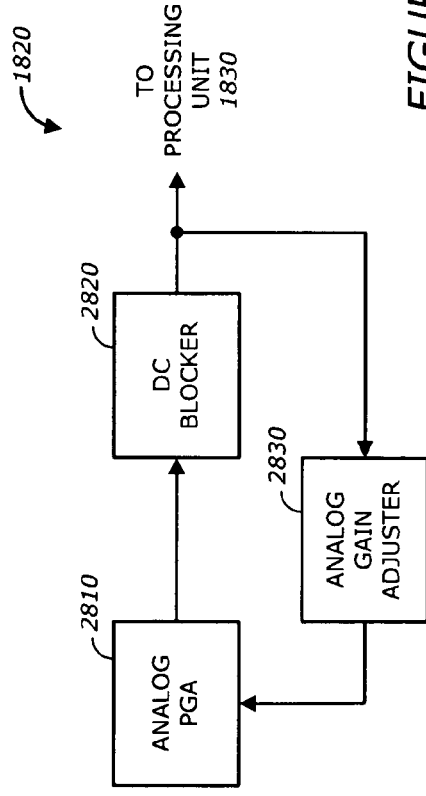
FIG. 28 is a diagram illustrating the analog AGC processor according to one embodiment.

FIG. 28 is a diagram illustrating the analog AGC processor 1820 according to one embodiment. The analog AGC processor 1820 includes an analog programmable gain amplifier (PGA) 2810, a direct current (DC) blocker 2820, and an analog gain adjuster 2830.

The analog PGA 2810 generates an amplified signal from the input signal using the analog adjustable gain. Note that the word "amplify" does not necessarily means an increase. It may also correspond to a decrease according to the gain value. The DC blocker 2820 blocks a DC component from the amplified signal to provide the first signal. The analog gain adjuster 2830 generates the analog adjustable gain to the analog PGA 2810 from the first signal.

Figure 29:
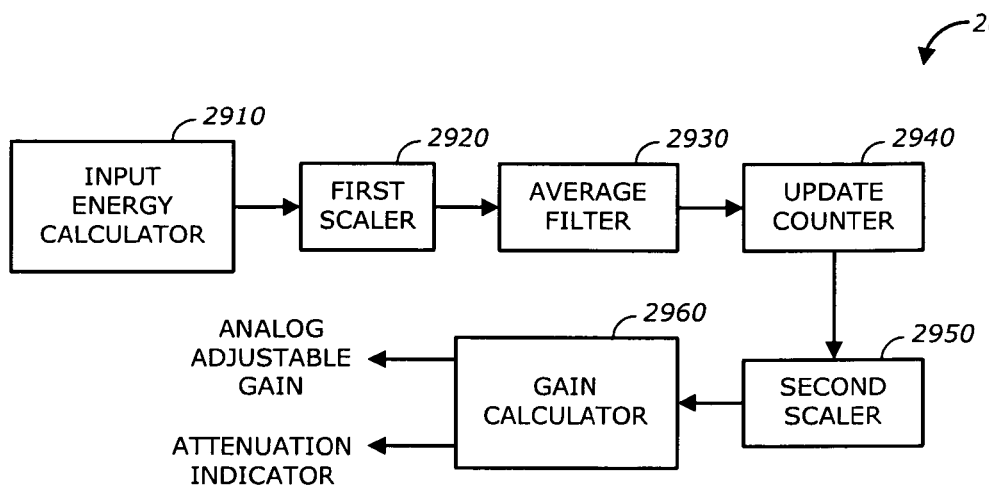
FIG. 29 is a diagram illustrating the analog gain adjuster according to one embodiment.

FIG. 29 is a diagram illustrating the analog gain adjuster 2830 according to one embodiment. The analog gain adjuster 2830 includes an input energy calculator 2910, a first scaler 2920, an average filter 2930, an update counter 2940, a second scaler 2950, and a gain calculator 2960.

The input energy calculator 2910 calculates an energy signal of the first signal. The energy value computed may be made accessible to the control unit of the system so that it may be used to report the RMS of the signal at the output of the analog PGA block. Note that this energy is the energy of the signal output of the analog PGA block whereas in the digital PGA the energy computed is the energy of the signal input to the digital PGA block. The energy may be computed by squaring the input and adding the result with a factor. In one embodiment, the input signal may be 8 bits and the result of the input energy calculator 2910 may be 24 bits. The first scaler 2920 scales the energy signal to provide a scaled energy signal. This may be performed by shifting the value right by an appropriate number of bits. In one embodiment, the output of the first scaler 2920 may be 16 bits. The average filter 2930 generates an averaged energy signal. It may be a moving average filter. In one embodiment, the output of the average filter 2930 is 21 bits. The update counter 2940 counts number of samples for update. The update counter 2940 generates an indicator to indicate whether the values as calculated by the gain calculator 2960 should be updated. In other words, the values calculated by the gain calculator 2960 are maintained during a pre-determined and programmable time interval or window. When the update counter 2940 reaches the update time, it passes the result of the average filter 2930 along the path to the gain calculator 2960 so that the new values are updated. In one embodiment, the time interval for update is equivalent to 256 samples. When the update counter 2940 value exceeds a pre-determined and programmable window length, denoted by windowLength, the result of the average filter 2930 is passed to the second scaler 2950. The second scaler 2950 scales the averaged energy signal to provide a current energy signal, denoted as analogCurrentEnergy. In one embodiment, the second scaler 2950 performs a right shift by 5 bits to scale the 21-bit result to 16-bit value. The gain calculator 2960 computes the analog adjustable gain and an attenuation indicator. The analog adjustable gain, denoted agcGainShift, may be computed as follows: computing gain by dividing a desired energy value, denoted by desiredAnalogEnergy, by the value of the current energy signal, then obtaining agcGainShift from gain=2^agcGainShift. The desired energy value specified the desired energy at the output of the analog PGA block. This computation will provide the additional gain (or attenuation) needed by the analog PGA 2810. The attenuation indicator, denoted by attenFlag, indicates whether attenuation is asserted.

The agcGainShift value here may specify DOUBLE the amount of additional shifting (amplification or attenuation) that the analog PGA 2810 may have to apply (because actual additional gain should be=SQRT(desiredAnalogEnergy/analogCurrentEnergy but in the analog gain adjuster 2830 we use desiredAnalogEnergy/analogCurrentEnergy to compute agcGainShift). Hence the actual amount of additional shifting may be agcGainShift/2. The amount specified by agcGainShift/2, may be the amount of additional gain that may need to be applied at the analog PGA 2810. This may be opposed to the digital PGA case where that value specified the total gain that the digital PGA may need to apply. The reason for the difference is that for digital PGA, currentEnergy specifies the energy at the input to the digital PGA processor 1840 (and hence to obtain the desired digital gain we divide the desired output energy by it), while for analog PGA 2810, analogCurrentEnergy specifies the energy at the output of the analog PGA processor 2810, and hence by dividing the desired output energy by this value may give us how much additional gain the analog PGA 2810 should apply. The analog gain adjuster 2830 may compute the signal energy over a minimum interval of 256 or 512 samples so this way at least every other P symbol may not be distorted (i.e., has same gain applied to all its samples). The analogcurrentEnergy value may need to be reset to zero every time we unfreeze the PGA so that it may not add computed energy of data from previous frame to P energy of current frame. The agcGainShift and the attenFlag may be used an indices to a look up table to provide proper gain values.

The gain calculator 2960 may include a difference processor and a rounding element. The difference processor computes a difference value between a desired energy value and a current energy value representing the current energy signal. The difference processor may normalize the desired energy value by the current energy value. The rounding element may be coupled to the difference processor to round the difference value to a nearest $2^P$ where P is a non-negative integer. The value of P/2 is used to specify amount of left or right shift representative of the analog adjustable gain as discussed above.

Figure 30:
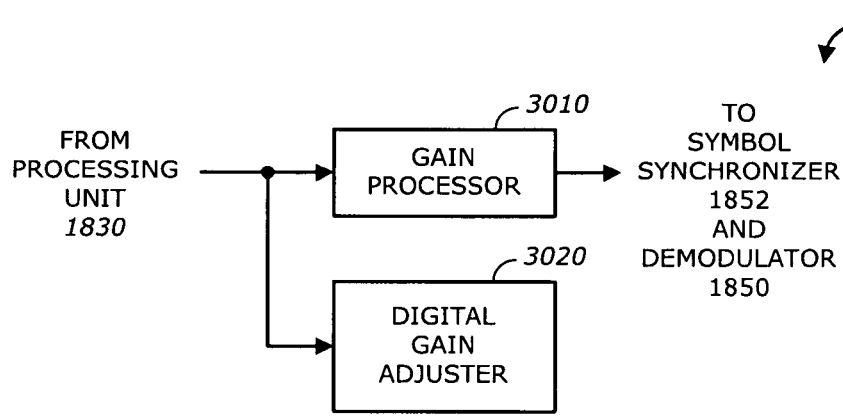
FIG. 30 is a diagram illustrating the digital AGC processor according to one embodiment.

FIG. 30 is a diagram illustrating the digital AGC processor 1840 according to one embodiment. The digital AGC processor 1840 includes a gain processor 3010 and a digital gain adjuster 3020.

The gain processor 3010 amplifies or attenuates the second signal based on the digital adjustable gain. The digital gain adjuster 3020 generates the digital adjustable gain to the gain processor 3010.

Figure 31:
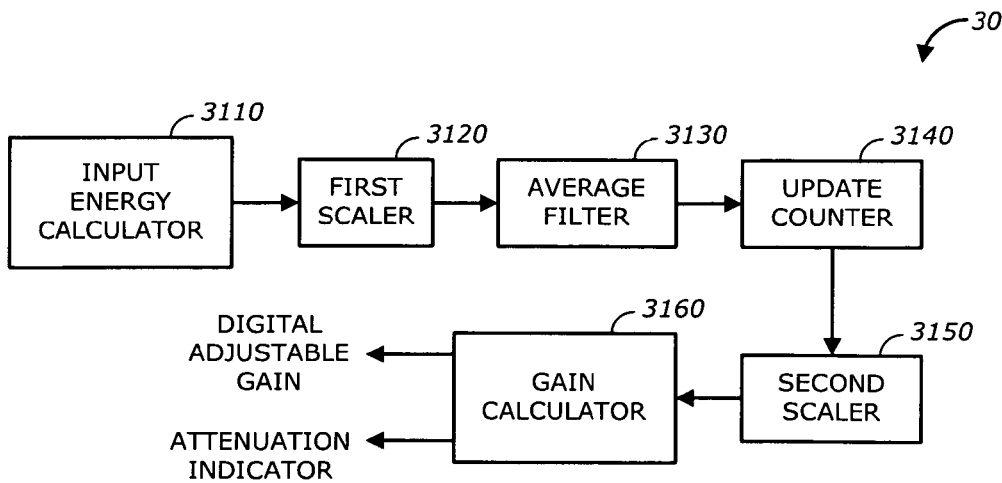
FIG. 31 is a diagram illustrating the digital gain adjuster according to one embodiment.

FIG. 31 is a diagram illustrating the digital gain adjuster 3020 according to one embodiment. The digital gain adjuster 3020 is similar to the analog gain adjuster 2830. It includes an input energy calculator 3110, a first scaler 3120, an average filter 3130, an update counter 3140, a second scaler 3150, and a gain calculator 3160.

The input energy calculator 3110 calculates an energy signal of the second signal. The first scaler 3120 scales the energy signal to provide a scaled energy signal. The average filter 3130 generates an averaged energy signal. The update counter 3140 counts number of samples for update. The second scaler 3150 scales the averaged energy signal to provide a current energy signal. The gain calculator 3160 computes the digital adjustable gain and an attenuation indicator. The operations of these components are similar to the operations described above for the analog gain adjuster 2830. For example, the gain calculator 3160 may include a difference processor and a rounding element. The difference processor computes a difference value between a desired energy value and a current energy value representing the current energy signal. The difference processor may normalize the desired energy value by the current energy value. The rounding element may be coupled to the difference processor to round the difference value to a nearest $2^P$ where P is a non-negative integer. The value of P is used to specify amount of left or right shift representative of the digital adjustable gain as discussed above.

There are several aspects of the combined analog PGA and the digital PGA block 2700.

In the state controller 2710, the analog state controller 2712, the processing state controller 2714, and the digital state controller 2716 work together to ensure consistent and smooth operations.

For the analog state controller 2712, a new state may need to be added right after the symbol synchronizer is enabled but before the digital PGA is frozen. This state may be referred to as "Adjust_Analog_Gain" state and will run for M symbols, where M is a pre-determined number, or until the symbol synchronization is achieved. Two designs may be proposed for the state machine, each with its advantages and disadvantages. In the first design, both analog and digital PGA may be updating at the same time and both may be unfrozen once the symbol synchronizer detects the symbol boundary. In the second design, the analog PGA may be allowed to adapt for first K, where K is a pre-determined number, symbols right after enabling synchronizer, during which the digital PGA may be frozen. After K symbols, the analog PGA may be frozen while the digital PGA starts adapting and continues adapting until the symbol synchronizer detects its $2^{nd}$ peak at which point the digital PGA is frozen.

Figure 32A:
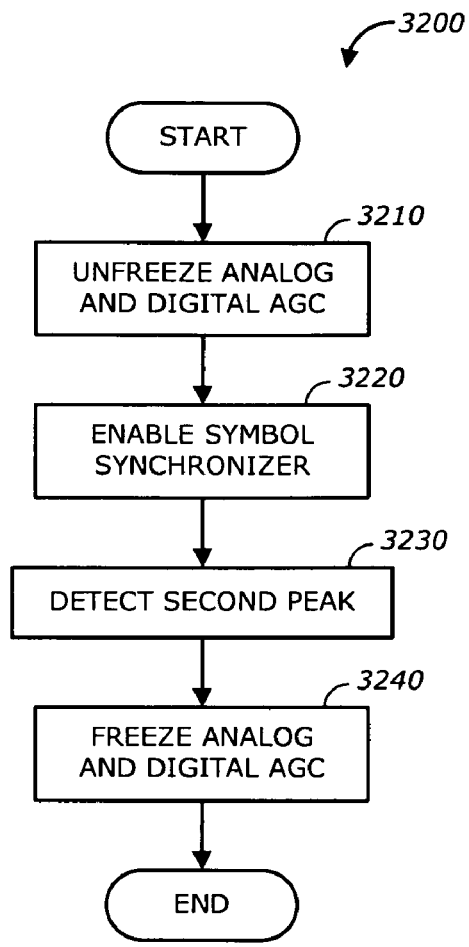
FIG. 32A is a diagram illustrating a process for the first design for the state control according to one embodiment.

FIG. 32A is a diagram illustrating a process 3200 for the first design for the state control according to one embodiment.

Upon START, the process 3200 unfreezes the analog and digital AGC (Block 3210). Next, the process 3200 enables the symbol synchronizer (Block 3220). Then, the process 3200 detects the second peak (Block 3230). Next, the process 3200 freezes the analog and digital AGC (Block 3240) and is then terminated.

Figure 32B:
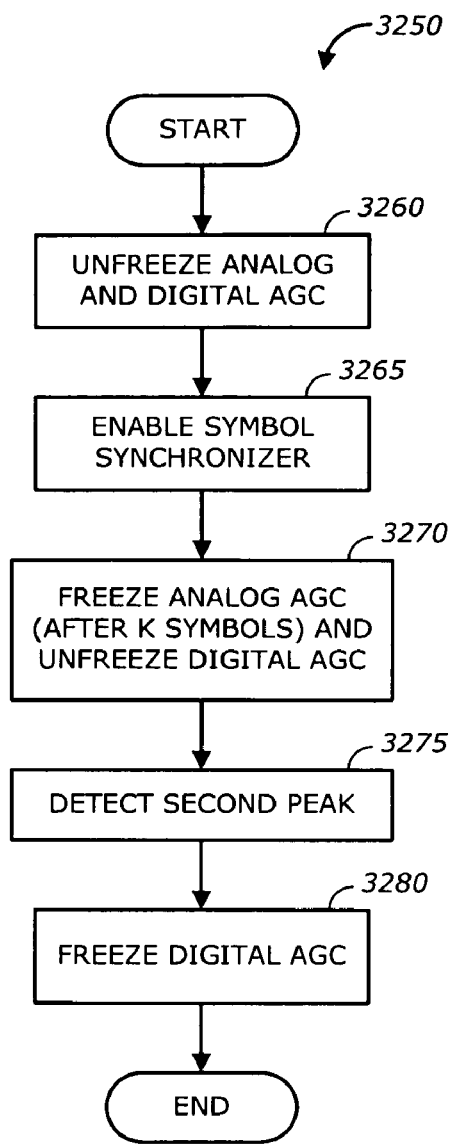
FIG. 32B is a diagram illustrating a process for the second design for the state control according to one embodiment.

FIG. 32B is a diagram illustrating a process 3250 for the second design for the state control according to one embodiment.

Upon START, the process 3250 unfreezes the analog and freezes the digital AGC (Block 3260). Next, the process 3250 enables the symbol synchronizer (Block 3265). Then, the process 3250 freezes the analog AGC after K symbols, where K is a pre-determined number, and unfreezes the digital AGC (Block 3270). Next, the process 3250 detects the second peak (Block 3275). Next, the process 3250 freezes the digital AGC (Block 3280) and is then terminated.

Figure 33:
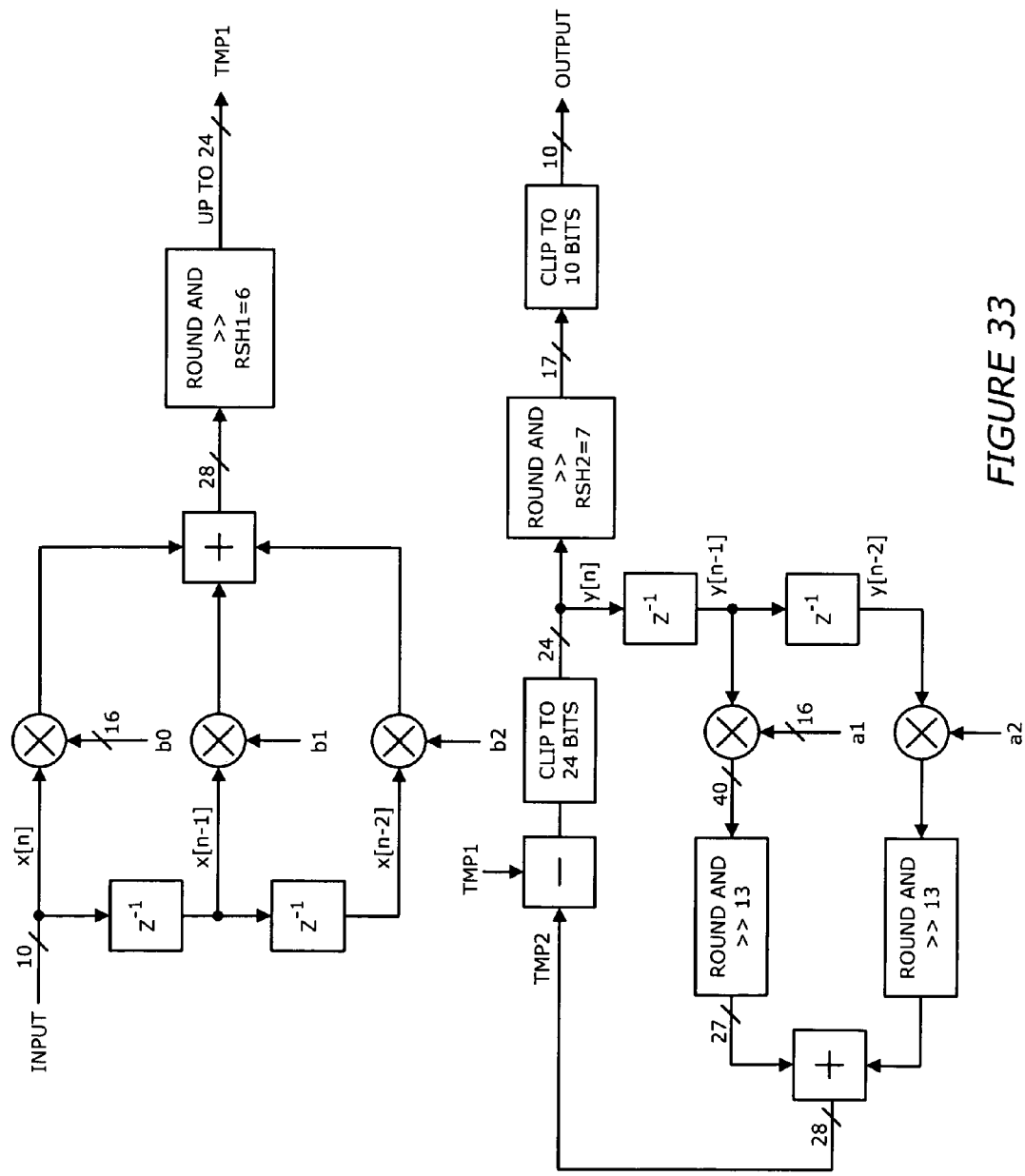
FIG. 33 is a diagram illustrating a filter according to one embodiment.

FIG. 33 is a diagram illustrating a filter 1832 or 1834 according to one embodiment. In order to reject the out of band noise and interference to the system filters may be used in the system. The filters 1832 and/or 1834 may represent a digital bandpass biquad IIR filter after the analog AGC processor 1820 and before the digital AGC processor 1840 in order to reduce out-of-band noise in the signal at the input of the digital AGC processor 1840, which results in significantly less fluctuations in the computed energy values and hence results in more stable computed gain values for the digital AGC processor 1840. As making sharp analog filter has some issues, a combination of analog and digital filters may be used in the system to realize the desired out of band attenuation. The quantization and coefficients may be less of a problem when IIR filter may be implemented in second order sections. Two SOS may be required that each implements a general second order transfer function of:

$$H(z) = \frac{b_0 + b_1 z^{-1} + b_2 z^{-2}}{1 + a_1 z^{-1} + a_2 z^{-2}}$$

Equivalently, the above transfer function may translate to the following difference equation:

$$y[n] = b_0 x[n] + b_1 x[n-1] + b_2 x[n-2] - a_1 y[n-1] - a_2 y[n-2]$$

So each filter may need to store x[n−1], x[n−2], y[n−1] and y[n−2]. The input may be sample x and corresponding output may be sample y. In order to have a better fixed-point performance, the formula for y[n] may be broken into two parts:

$$Temp1 = (b_0 x[n] + b_1 x[n-1] + b_2 x[n-2])$$

$$Temp2 = (a_1 y[n-1] + a_2 y[n-2])$$

$$y[n] = Temp1 - Temp2$$

The filters may have identical structure and each filter may be configured with a set of coefficients to be LP or HP filter and combinations of LP-LP and LP-HP may be used in this set up. The coefficients are standard related so can reside in configuration memory. The input and output may be 10-bits each. For stable/minimum phase butter-worth IIR filter, the coefficients are between [−2,2]. By using 16 bit coefficients, we may accommodate coefficients in the range [−4,4]. It should be noted that for stable IIR filter bit growth may be limited. At the beginning of each frame, the filter may be initialized with the history values all being reset to zero i.e. x[n−1]=x[n−2]=y[n−1]=y[n−2]=0.

Figure 34:
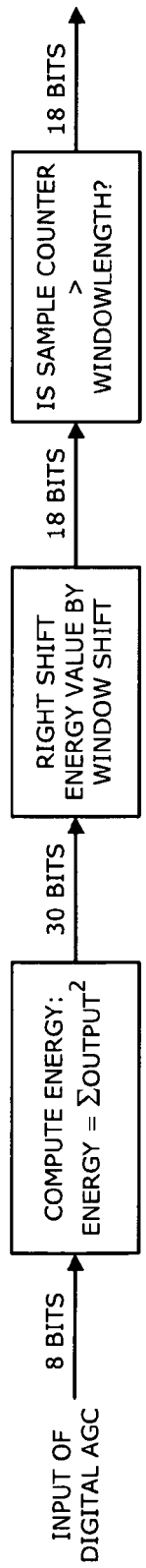
FIG. 34 is a diagram illustrating the RMS module according to one embodiment.

FIG. 34 is a diagram illustrating the RMS module 1838 according to one embodiment. The RMS module or block 1838 may be placed right before the digital AGC and may be running all the time whether AGC is enabled or disabled, frozen or unfrozen. This block may compute the energy at the input of the digital AGC in the same way that the digital AGC block computes the energy of the digital AGC input; however, this block may perform measurement over much longer time leading to a more accurate measurement. Note that this block will be computing the energy of the input signal and not the rms. Computing the RMS may require taking the square root of the computed energy value, which may be done offline by the user.

By computing the input energy, we may also compute the output energy by simply multiplying by the gain of the digital AGC. In this case, the value of the gain that may be used in the computation may be chosen as follows:

i) if AGC is disabled, gain=1.

ii) If AGC is enabled and is in tracking mode, then gain=agcGainShift that is obtained from Adjust_PGA_Gain( ) block.

iii) If AGC is enabled and is frozen, then gain=oldAgcGain (note that agcGainShift keeps getting updated by Adjust_PGA_Gain( ) block but we ignore this value).

In one embodiment, by limiting output of "Compute Energy" block to 30 bits, we are allowing this block to compute energy on a maximum length of $2^{14}$ (=16,384) samples since each sample energy may be 16 bits and we may accumulate up to 16,384 values we can get a result that occupies up to 30 bits. Note that for CENELEC C the frame length is 219,140 so at best we may measure energy over 7.5% of its length.

RMS Module State Control:

The processing state controller 2714 may control the RMS module 1838. The RMS module 1838 may be triggered to start computing the signal energy by one of two signals, depending on the value of a control bit "RMS free-running mode control bit". If this bit is set to 1 it means we want the rms block to compute the energy of noise instead of the energy of the received signal. In this case, the RMS module 1838 should be triggered by a timer that triggers it once every sec. It will be the user's responsibility to make sure that the transmitter is not transmitting during the time the RMS module 1838 is configured in "free-running mode" since the purpose of this mode may be to measure the energy of the noise only. On the other hand, if the "RMS free-running mode control bit" is set to 0, then it means we want to measure the energy of the received data. In this case, the RMS module 1838 may be triggered to start its computation whenever it receives the "start of data" signal which indicates that we have detected the frame sync and are now ready to decode data. The purpose of having these two modes is to allow us to compute both the signal energy and noise energy, hence, allows us to compute the SNR of the received signal.

In both cases, once the trigger signal is received, the RMS module 1838 may start computing the digital AGC input energy over a predefined number of samples that is currently set to 8192 samples and is programmable by the user. The number of samples has to be in the form $2^N$ where N is an integer of maximum value=14. Moreover, when the RMS module 1838 may not be in "free-running mode", the number of samples may not be greater than the length of one data frame, which, for example, may be 11,120 samples for FCC standard. Once the computation has been done over all $2^N$ samples, the resultant 18-bit energy value may be stored in the "RMS Digital AGC input" register that should be made accessible to the MCU. The RMS module 1838 will then get the proper FROZEN digital AGC gain value and multiply it by the computed input energy value and store the result in the "RMS Digital AGC output" register. The RMS module 1838 may then clear all its energy registers so that when it gets the next trigger, a new energy value may be computed. Note however, that the registers "RMS for Digital AGC input" and "RMS for Digital AGC output" may not be cleared, but rather should be updated at the end of each frame. Whenever the MCU wants to get the RMS value it will simply read the registers and the values there will be the input and output energy from the previous trigger.

The sequence of events may be summarized as follows:

1) The RMS block state control may check if the RMS free-running mode control bit is 0 or 1.

1a) If RMS free-running mode control bit=1 then the RMS module 1838 may start computing the energy when it receives a trigger from a 1 sec timer.

1b) If RMS free-running mode control bit=0 then the RMS module 1838 will start computing the energy when it receives a trigger from "start of data" signal.

2) The RMS module 1838 may finish its energy computation of current frame when it has summed the energy values over the number of samples specified in register "RMS Window Length".

3) The resultant 18-bit energy value may be stored in the "RMS Digital AGC input" register.

4) The RMS module state machine may then check if the digital AGC is enabled or disabled.

a) If the digital AGC is disabled, then the computed input energy value may also be copied to the "RMS Digital AGC output" register since input and output energy values may be the same because disabling the digital AGC is equivalent to having unity gain.

b) If the digital AGC is enabled, then the RMS module 1838 will get the proper FROZEN digital AGC gain value and multiply it by the computed input energy value and store the result in the "RMS Digital AGC output" register. Note that when the RMS module 1838 is running in free mode, the digital AGC is usually unfrozen, and so in this case the value stored in the "RMS Digital AGC output" register may be ignored by the user since it may be computed using the FROZEN digital AGC gain value.

5) The RMS module 1838 may then clear all its INTERNAL energy registers so that for next trigger a new energy value is computed. Note that external registers "RMS for Digital AGC input" and "RMS for Digital AGC output" may not be cleared and instead may keep the same energy value until they get updated with the next frame (or next trigger in case of free running mode) energy value.

It may be possible to design the RMS module state control in such a way that when it is not in free-running mode, it can compute two RMS values for each frame: one RMS value for the preamble symbols and another RMS value for the data symbols.

Figure 35:
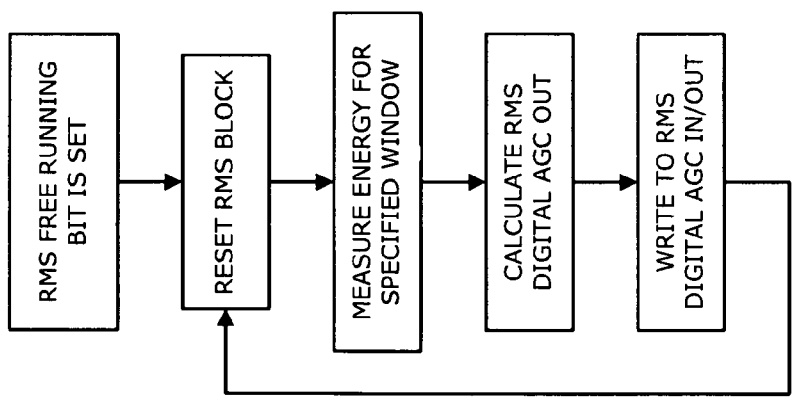
FIG. 35 is a diagram illustrating the free-running mode of the RMS module according to one embodiment.

FIG. 35 is a diagram illustrating the free-running mode of the RMS module 1838 according to one embodiment. It should be noted that when in free run mode, the block keeps running and updating its measurement until the RMS free running bit is reset. It is MAC responsibility to decide whether the measurement is valid or not. Note that the AGC may not be frozen so the AGC gain may change. The gain of 1 may be used in the computation (i.e. RMS Digital AGC Out=RMS Digital AGC In).

Figure 36:
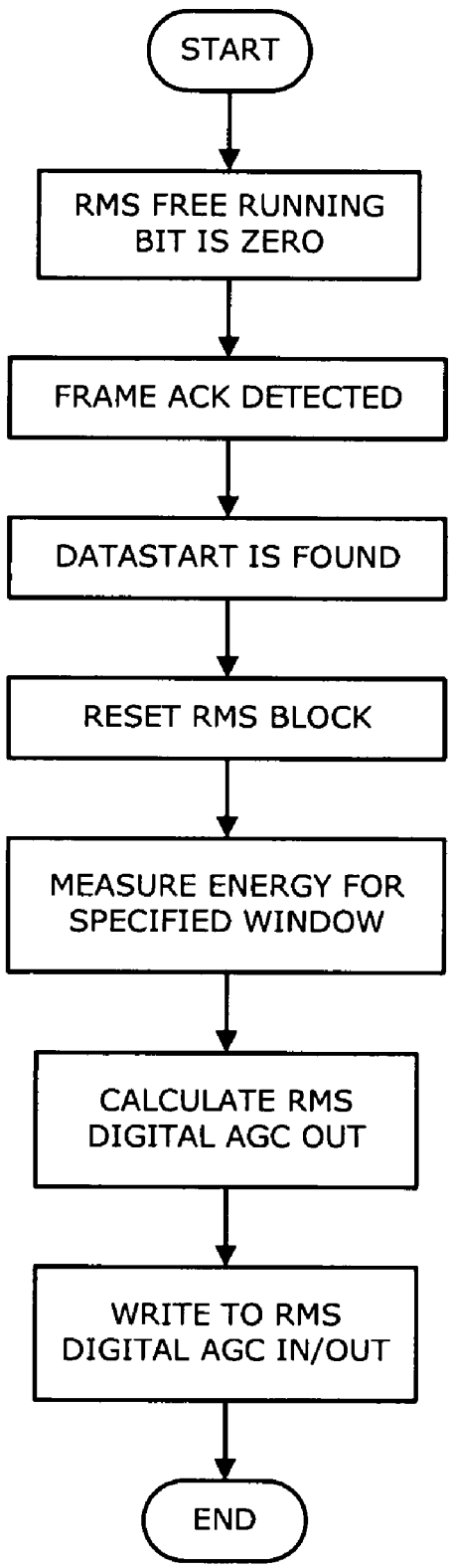
FIG. 36 is a diagram illustrating the data energy measurement mode of the RMS module according to one embodiment

FIG. 36 is a diagram illustrating the data energy measurement mode of the RMS module 1838 according to one embodiment. This mode may trigger by the frame detected flag and starts computing the energy of the data starting from sample with index dataStart (known after frame detection). This mode may measure the energy once per frame and writes the values. For Data the AGC is already frozen so for calculating RMS Digital AGC Out, OldAttenFlag and OldAgcGain may be used.

For data, the AGC may be frozen so the block that measures RMS digital AGC Out may use the following equation:

```
If AGC_ENABLE
    If AttenFlag = 0
        RMS Digital AGC Out= RMS Digital AGC In << AgcGain;
    Else
        RMS Digital AGC Out = RMS Digital AGC In >> AgcGain;
End
```

Figure 37:
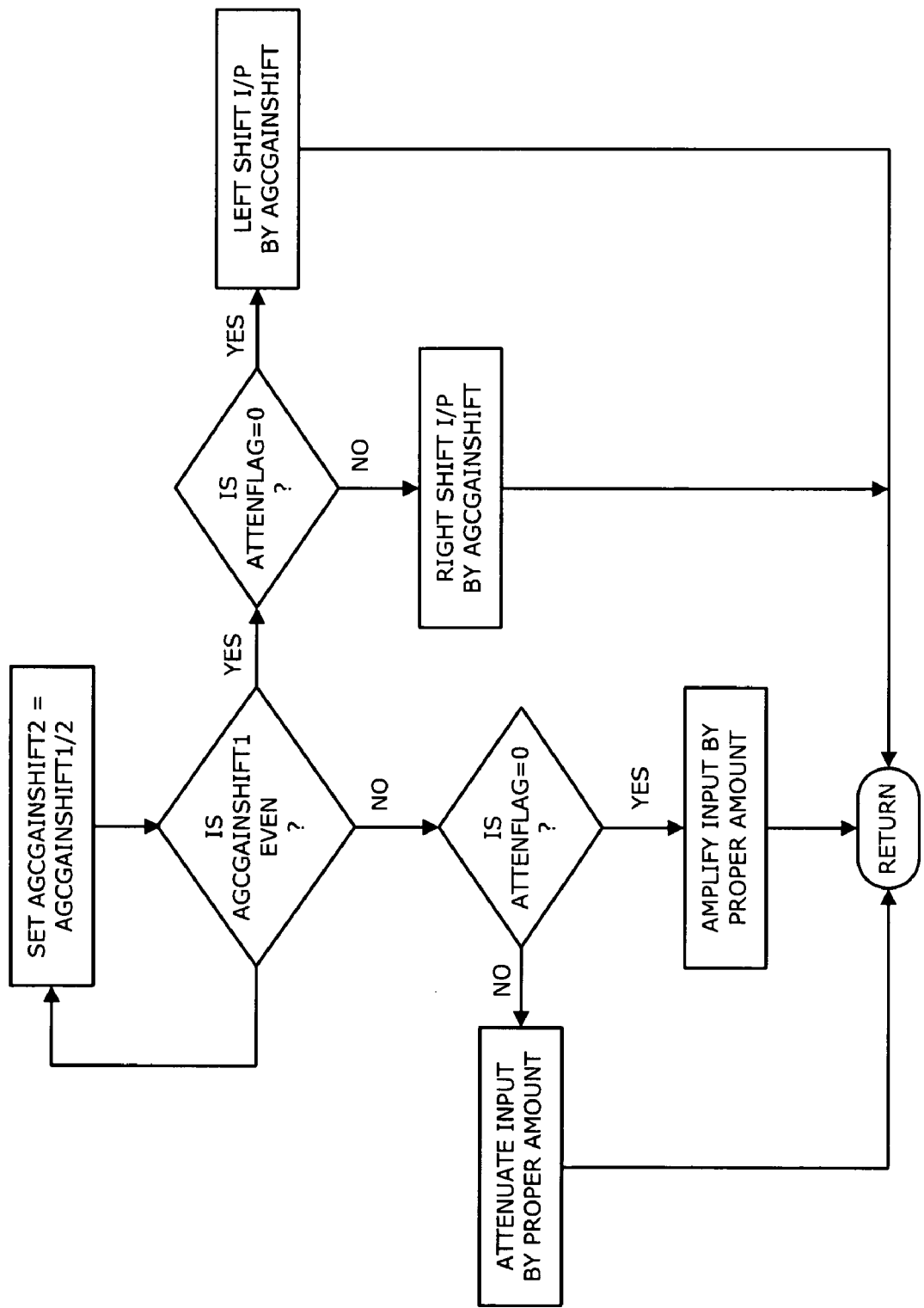
FIG. 37 is a diagram illustrating a process for the digital AGC processor according to one embodiment.

FIG. 37 is a diagram illustrating a process for the digital AGC processor according to one embodiment.

Figure 38:
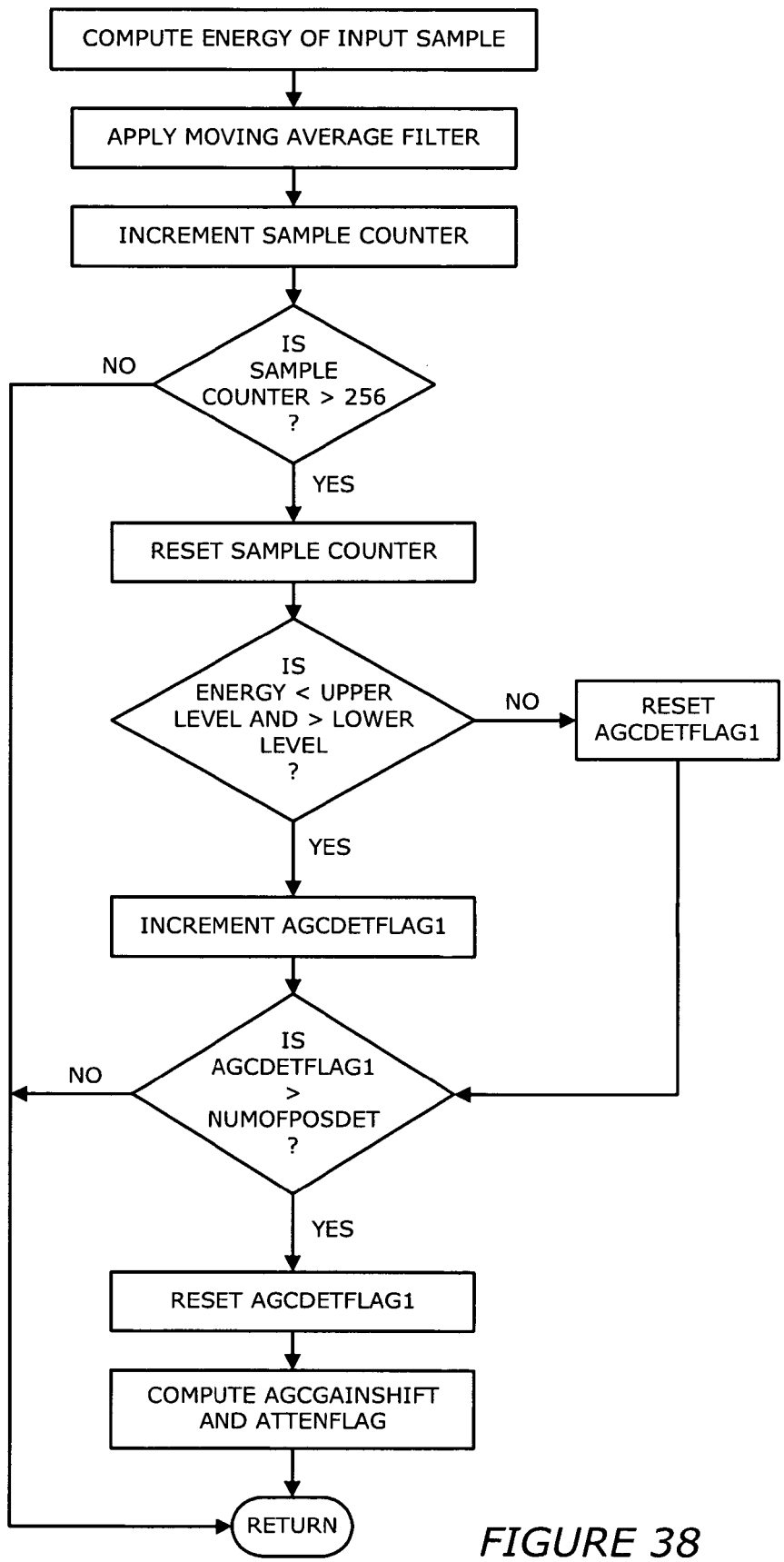
FIG. 38 is a diagram illustrating a process for the gain adjustment according to one embodiment.

FIG. 38 is a diagram illustrating a process for the gain adjustment according to one embodiment.

AGC State Control:

The AGC system may be in one of two states: training state or "frozen" state.

Training state: In this state the digital gain adjuster 3020 (see FIG. 37) may be updating the values of agcGainShift and attenFlag, and the gain processor 3010 may be using those updated values. The attenFlag (1 bit) may be an input to function that computes the digital AGC. It is provided as output from the digital gain adjuster 3020 but should also be programmable by user.

Frozen state: In this state the gain processor 3010 may use the values of agcGainShift and attenFlag that may be computed by the digital gain adjuster 3020 right at the end of the training state, and it may ignore any updated values until it exits this state and goes back to Training state.

The AGC system may be set in Training mode right at the end of each data frame (which is also the location where the symbol synchronizer is enabled), and may be switched to "frozen" mode when the symbol synchronizer may detect second peak (i.e., when Symbol_Sync_Flag=TRUE). Moreover, during the first symbol in its training mode, the gain processor 3010 should use the agcGainShift and attenFlag values from its previous frozen state until new updated values (for the current state) are available from the digital gain adjuster 3020. This means it may reset the ACG sample counter to zero. Note that the AGC state control may be precisely synchronized with the synchronizer state control in order to avoid any degradation in performance.

Elements of one embodiment may be implemented by hardware, firmware, software or any combination thereof. The term hardware generally refers to an element having a physical structure such as electronic, electromagnetic, optical, electro-optical, mechanical, electromechanical parts, etc. A hardware implementation may include analog or digital circuits, devices, processors, applications specific integrated circuits (ASICs), programmable logic devices (PLDs), field programmable gate arrays (FPGAs), or any electronic devices. The term software generally refers to a logical structure, a method, a procedure, a program, a routine, a process, an algorithm, a formula, a function, an expression, etc. The term firmware generally refers to a logical structure, a method, a procedure, a program, a routine, a process, an algorithm, a formula, a function, an expression, etc., that is implemented or embodied in a hardware structure (e.g., flash memory, ROM, EPROM). Examples of firmware may include microcode, writable control store, micro-programmed structure. When implemented in software or firmware, the elements of an embodiment are essentially the code segments to perform the necessary tasks. The software/firmware may include the actual code to carry out the operations described in one embodiment, or code that emulates or simulates the operations.

The program or code segments can be stored in a processor or machine accessible medium. The "processor readable or accessible medium" or "machine readable or accessible medium" may include any medium that may store, transmit, receive, or transfer information. Examples of the processor readable or machine accessible medium that may store include a storage medium, an electronic circuit, a semiconductor memory device, a read only memory (ROM), a flash memory, an erasable programmable ROM (EPROM), a floppy diskette, a compact disk (CD) ROM, an optical disk, a hard disk, etc. The machine accessible medium may be embodied in an article of manufacture. The machine accessible medium may include information or data that, when accessed by a machine, cause the machine to perform the operations or actions described above. The machine accessible medium may also include program code, instruction or instructions embedded therein. The program code may include machine readable code, instruction or instructions to perform the operations or actions described above. The term "information" or "data" here refers to any type of information that is encoded for machine-readable purposes. Therefore, it may include program, code, data, file, etc.

All or part of an embodiment may be implemented by various means depending on applications according to particular features, functions. These means may include hardware, software, or firmware, or any combination thereof. A hardware, software, or firmware element may have several modules coupled to one another. A hardware module is coupled to another module by mechanical, electrical, optical, electromagnetic or any physical connections. A software module is coupled to another module by a function, procedure, method, subprogram, or subroutine call, a jump, a link, a parameter, variable, and argument passing, a function return, etc. A software module is coupled to another module to receive variables, parameters, arguments, pointers, etc. and/or to generate or pass results, updated variables, pointers, etc. A firmware module is coupled to another module by any combination of hardware and software coupling methods above. A hardware, software, or firmware module may be coupled to any one of another hardware, software, or firmware module. A module may also be a software driver or interface to interact with the operating system running on the platform. A module may also be a hardware driver to configure, set up, initialize, send and receive data to and from a hardware device. An apparatus may include any combination of hardware, software, and firmware modules.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. An apparatus to process an input signal in a power line communication system, comprising:

an analog automatic gain control (AGC) processor to control an analog adjustable gain of the input signal received via a power line using a feedback mechanism, wherein the input signal is modulated using Orthogonal Frequency Division Multiplexing, the analog AGC processor generating a first signal;

a processing unit coupled to the analog AGC processor, the processing unit comprising an infinite impulse response (IIR) filter to remove from the first signal an out-of-band noise resulting from transmission of electricity and the input signal over the power line, wherein the IIR filter includes a digital band-pass biquad IIR filter of second-order that is initialized at a beginning of each frame; and a jammer canceller coupled to the IIR filter to cancel interference resulting from transmission of electricity and the input signal over the power line from an output of the IIR filter and to generate a second signal; and a digital AGC processor coupled to the processing unit to control a digital adjustable gain of the second signal using a feed-forward mechanism and to compensate for attenuation in the second signal resulting from the jammer canceller canceling the interference.

2. The apparatus of claim 1 wherein the analog AGC processor comprises:

an analog programmable gain amplifier (PGA) to generate an amplified signal from the input signal using the analog adjustable gain;

a direct current (DC) blocker coupled to the analog PGA to block a DC component from the amplified signal to provide the first signal; and an analog gain adjuster coupled to the DC blocker to generate the analog adjustable gain to the analog PGA from the first signal.

3. The apparatus of claim 2 wherein the analog gain adjuster comprises:

an input energy calculator to calculate an energy signal of the first signal;

a first scaler coupled to the energy calculator to scale the energy signal to provide a scaled energy signal;

an average filter coupled to the first scaler to generate an averaged energy signal;

an update counter to count number of samples for update;

a second scaler coupled to the average filter to scale the averaged energy signal to provide a current energy signal; and a gain calculator coupled to the second scaler to compute the analog adjustable gain and an attenuation indicator.

4. The apparatus of claim 3 wherein the gain calculator comprises:

a difference processor to compute a difference value between a desired energy value and a current energy value representing the current energy signal; and a rounding element coupled to the difference processor to round the difference value to a nearest $2^P$ where P is a non-negative integer, value of P/2 being used to specify amount of left or right shift representative of the analog adjustable gain.

5. The apparatus of claim 1 wherein the processing unit comprises:

an energy calculator to calculate an energy signal of the first signal.

6. The apparatus of claim 1 wherein the digital AGC processor comprises:

a gain processor to amplify or attenuate the second signal based on the digital adjustable gain; and a digital gain adjuster coupled to the gain processor to generate the digital adjustable gain to the gain processor.

7. The apparatus of claim 6 wherein the digital gain adjuster comprises:

an input energy calculator to calculate an energy signal of the second signal;

a first scaler coupled to the energy calculator to scale the energy signal to provide a scaled energy signal;

an average filter coupled to the first scaler to generate an averaged energy signal;

an update counter to count number of samples for update;

a second scaler coupled to the average filter to scale the averaged energy signal to provide a current energy signal; and a gain calculator coupled to the second scaler to compute the digital adjustable gain and an attenuation indicator.

8. The apparatus of claim 7 wherein the gain calculator comprises:

a difference processor to compute a difference value between a desired energy value and a current energy value representing the current energy signal; and a rounding element coupled to the difference processor to round the difference value to a nearest $2^P$ where P is a non-negative integer, value of P being used to specify amount of left or right shift representative of the digital adjustable gain.

9. The apparatus of claim 1 further comprising:

an analog state controller coupled to the analog AGC processor to control state of the analog AGC processor, the analog state controller generating an analog control signal to freeze and unfreeze the analog AGC processor;

a processing state controller coupled to the processing unit to control state of the processing unit; and a digital state controller coupled to the digital AGC processor to control state of the digital AGC processor, the digital state controller generating a digital control signal to freeze and unfreeze the digital AGC processor, the digital control signal being generated independently from the analog control signal.

10. The apparatus of claim 1 wherein the analog AGC processor comprises:

an analog programmable gain amplifier (PGA) to generate an amplified signal from the input signal using the analog adjustable gain; and an analog gain adjuster to generate the analog adjustable gain to the analog PGA from the first signal, the analog gain adjuster comprising a gain calculator to compute the analog adjustable gain and an attenuation indicator;

wherein the gain calculator comprises:

a difference processor to compute a difference value between a desired energy value and a current energy value representing a current energy signal, and a rounding element coupled to the difference processor to round the difference value to a nearest $2^P$ where P is a non-negative integer, value of P/2 being used to specify amount of left or right shift representative of the analog adjustable gain.

11. The apparatus of claim 1 wherein the digital AGC processor comprises:

a gain processor to amplify or attenuate the second signal based on the digital adjustable gain; and a digital gain adjuster coupled to the gain processor to generate the digital adjustable gain to the gain processor, the digital gain adjuster comprising a gain calculator to compute the digital adjustable gain and an attenuation indicator;

wherein the gain calculator comprises:

a difference processor to compute a difference value between a desired energy value and a current energy value representing a current energy signal, and a rounding element coupled to the difference processor to round the difference value to a nearest $2^P$ where P is a non-negative integer, value of P being used to specify amount of left or right shift representative of the digital adjustable gain.

12. A method for processing an input signal in a power line communication system comprising:

controlling an analog adjustable gain of the input signal received via a power line using a feedback mechanism to generate a first signal using an analog automatic gain control (AGC) processor, wherein the input signal is modulated using Orthogonal Frequency Division Multiplexing;

transforming the first signal into a second signal, wherein transforming the first signal comprises
removing from the first signal an out-of-band noise resulting from transmission of electricity and the input signal over the power line using an infinite impulse response (IIR) filter, wherein the IIR filter includes a digital band-pass biquad IIR filter of second-order that is initialized at a beginning of each frame; and canceling interference resulting from transmission of electricity and the input signal over the power line from an output of the IIR filter using a jammer canceller coupled to the IIR filter and generating the second signal; and controlling a digital adjustable gain of the second signal using a feed-forward mechanism using a digital AGC processor; and compensating for attenuation in the second signal resulting from the jammer canceller canceling the interference.

13. The method of claim 12 wherein controlling the analog adjustable gain comprises:

generating an amplified signal from the input signal using the analog adjustable gain;

blocking a DC component from the amplified signal to provide the first signal; and generating the analog adjustable gain from the first signal.

14. The method of claim 13 wherein generating the analog adjustable gain comprises:

calculating an energy signal of the first signal;

scaling the energy signal to provide a scaled energy signal;

generating an averaged energy signal from the scaled energy signal;

counting number of samples for update;

scaling the averaged energy signal to provide a current energy signal; and computing the analog adjustable gain and an attenuation indicator from the current energy signal.

15. The method of claim 14 wherein computing the analog adjustable gain comprises:

computing a difference value between a desired energy value and a current energy value representing the current energy signal; and rounding the difference value to a nearest $2^P$ where P is a non-negative integer, value of P/2 being used to specify amount of left or right shift representative of the analog adjustable gain.

16. The method of claim 12 wherein transforming the first signal comprises:

calculating an energy signal of the first signal.

17. The method of claim 12 wherein controlling a digital adjustable gain comprises:

amplifying or attenuating the second signal based on the digital adjustable gain; and generating the digital adjustable gain.

18. The method of claim 17 wherein generating the digital adjustable gain comprises:

calculating an energy signal of the second signal;

scaling the energy signal to provide a scaled energy signal;

generating an averaged energy signal from the scaled energy signal;

counting number of samples for update;

scaling the averaged energy signal to provide a current energy signal; and computing the digital adjustable gain and an attenuation indicator from the current energy signal.

19. The method of claim 18 wherein computing the digital adjustable gain comprises:

computing a difference value between a desired energy value and a current energy value representing the current energy signal; and rounding the difference value to a nearest $2^P$ where P is a non-negative integer, value of P being used to specify amount of left or right shift representative of the digital adjustable gain.

20. The method of claim 12 further comprising:

controlling state of the analog AGC processor, comprising generating an analog control signal to freeze and unfreeze the analog AGC processor;

controlling state of a processing unit used to transform the first signal into the second signal; and controlling state of the digital AGC processor, comprising generating a digital control signal to freeze and unfreeze the digital AGC processor, the digital control signal being generated independently from the analog control signal.

21. A system to process an input signal in a power line communication system comprising:

a front end processing module to process the input signal received via a power line, wherein the input signal is modulated using Orthogonal Frequency Division Multiplexing, the front end processing module comprising:
an analog automatic gain control (AGC) processor to control an analog adjustable gain of the input signal using a feedback mechanism, the analog AGC processor generating a first signal;
a processing unit coupled to the analog AGC processor, the processing unit comprising
an infinite impulse response (IIR) filter to remove from the first signal an out-of-band noise resulting from transmission of electricity and the input signal over the power line, wherein the IIR filter includes a digital band-pass biquad IIR filter of second-order that is initialized at a beginning of each frame; and
a jammer canceller coupled to the IIR filter to cancel interference resulting from transmission of electricity and the input signal over the power line from an output of the IIR filter and to generate a second signal; and
a digital AGC processor coupled to the processing unit to control a digital adjustable gain of the second signal using a feed-forward mechanism, to compensate for attenuation in the second signal resulting from the jammer canceller canceling the interference, and to generate an output signal;

a demodulator coupled to the front end processing module to demodulate a packet obtained from the output signal; and a decoder coupled to the demodulator to decode the demodulated packet.

22. The system of claim 21 wherein the analog AGC processor comprises:

an analog programmable gain amplifier (PGA) to generate an amplified signal from the input signal using the analog adjustable gain;

a direct current (DC) blocker coupled to the analog PGA to block a DC component from the amplified signal to provide the first signal; and an analog gain adjuster coupled to the DC blocker to generate the analog adjustable gain to the analog PGA from the first signal.

23. The system of claim 22 wherein the analog gain adjuster comprises:
   an input energy calculator to calculate an energy signal of the first signal;
   a first scaler coupled to the energy calculator to scale the energy signal to provide a scaled energy signal;
   an average filter coupled to the first scaler to generate an averaged energy signal;
   an update counter to count number of samples for update;
   a second scaler coupled to the average filter to scale the averaged energy signal to provide a current energy signal; and
   a gain calculator coupled to the second scaler to compute the analog adjustable gain and an attenuation indicator.

24. The system of claim 21 wherein the digital AGC processor comprises:
   a gain processor to amplify or attenuate the second signal based on the digital adjustable gain; and
   a digital gain adjuster coupled to the gain processor to generate the digital adjustable gain to the gain processor.

25. The system of claim 24 wherein the digital gain adjuster comprises:
   an input energy calculator to calculate an energy signal of the second signal;
   a first scaler coupled to the energy calculator to scale the energy signal to provide a scaled energy signal;
   an average filter coupled to the first scaler to generate an averaged energy signal;
   an update counter to count number of samples for update;
   a second scaler coupled to the average filter to scale the averaged energy signal to provide a current energy signal; and
   a gain calculator coupled to the second scaler to compute the digital adjustable gain and an attenuation indicator.

26. The system of claim 21 wherein the front end processing module further comprises:
   an analog state controller coupled to the analog AGC processor to control state of the analog AGC processor, the analog state controller generating an analog control signal to freeze and unfreeze the analog AGC processor;
   a processing state controller coupled to the processing unit to control state of the processing unit; and
   a digital state controller coupled to the digital AGC processor to control state of the digital AGC processor, the digital state controller generating a digital control signal to freeze and unfreeze the digital AGC processor, the digital control signal being generated independently from the analog control signal.

27. The system of claim 21 wherein the demodulator is an orthogonal frequency division multiplexing (OFDM) demodulator.

* * * * *

UNITED STATES PATENT AND TRADEMARK OFFICE
CERTIFICATE OF CORRECTION

PATENT NO. : 8,149,967 B2
APPLICATION NO. : 12/478689
DATED : April 3, 2012
INVENTOR(S) : Maher Umari et al.

It is certified that error appears in the above-identified patent and that said Letters Patent is hereby corrected as shown below:

In the Drawings:

Sheet 12 of 25, Reference Numeral 1870, Fig. 18     Delete "SELECTOR" and insert --DETECTOR--

In the Specifications:

| | |
|---|---|
| Column 3, Line 12 | Delete "embodiment" and insert --embodiment.-- |
| Column 5, Line 46 | After "less", insert --than-- |
| Column 11, Line 9 | After "820", delete "may be" |
| Column 15, Line 7 | Delete "In" and insert --in-- |
| Column 15, Line 7 | Delete "$n_{th}$", and insert --$n^{th}$-- |
| Column 15, Line 9 | Delete "$(n-1)_{th}$" and insert --$(n-1)^{th}$-- |
| Column 15, Line 10 | Delete "$(n+1)_{th}$" and insert --$(n+1)^{th}$-- |
| Column 16, Line 18 | After "include", delete "of" |
| Column 16, Line 21 | Delete "four" and insert --4-- |
| Column 19, Line 3 | Delete "4.15" and insert --4-- |
| Column 19, Line 60 | Delete "ie.g.," and insert --e.g.,-- |
| Column 24, Line 65 | Delete "rms", insert --RMS-- |
| Column 25, Line 27 | Delete "rms", insert --RMS-- |

Signed and Sealed this
Third Day of September, 2013

Teresa Stanek Rea
*Acting Director of the United States Patent and Trademark Office*